US007968361B2

(12) United States Patent
Osawa et al.

(10) Patent No.: US 7,968,361 B2
(45) Date of Patent: Jun. 28, 2011

(54) GAN BASED SEMICONDUCTOR LIGHT EMITTING DEVICE AND LAMP

(75) Inventors: Hiroshi Osawa, Chiba (JP); Hironao Shinohara, Ichihara (JP)

(73) Assignee: Showa Denko K.K., Tokyo (JP)

( * ) Notice: Subject to any disclaimer, the term of this patent is extended or adjusted under 35 U.S.C. 154(b) by 149 days.

(21) Appl. No.: 12/295,206

(22) PCT Filed: Mar. 30, 2007

(86) PCT No.: PCT/JP2007/057159
§ 371 (c)(1),
(2), (4) Date: Sep. 29, 2008

(87) PCT Pub. No.: WO2007/119619
PCT Pub. Date: Oct. 25, 2007

(65) Prior Publication Data
US 2009/0114933 A1 May 7, 2009

(30) Foreign Application Priority Data

Mar. 31, 2006 (JP) ................... 2006-096340

(51) Int. Cl.
*H01L 21/66* (2006.01)
(52) U.S. Cl. ............... 438/47; 438/22; 438/29; 438/32; 438/42; 438/44; 257/14; 257/76; 257/79; 257/94; 257/98; 257/E21.131
(58) Field of Classification Search .............. None
See application file for complete search history.

(56) References Cited

U.S. PATENT DOCUMENTS

| 4,675,875 | A | * | 6/1987 | Takamiya ................. 372/45.01 |
| 4,958,202 | A | * | 9/1990 | Kinoshita et al. ............... 257/96 |
| 6,040,588 | A | * | 3/2000 | Koide et al. ..................... 257/15 |
| 6,091,083 | A | * | 7/2000 | Hata et al. ........................ 257/79 |
| 6,109,175 | A | * | 8/2000 | Kinoshita ..................... 101/170 |
| 6,304,329 | B1 | * | 10/2001 | Nitta et al. .................... 356/459 |
| 2003/0064251 | A1 | * | 4/2003 | Uwazumi et al. ...... 428/694 BM |
| 2003/0119239 | A1 | * | 6/2003 | Koike et al. .................... 438/200 |
| 2004/0094412 | A1 | * | 5/2004 | Navala et al. ............ 204/298.23 |
| 2004/0113166 | A1 | * | 6/2004 | Tadatomo et al. .............. 257/98 |
| 2004/0231980 | A1 | | 11/2004 | Takahashi |
| 2005/0082546 | A1 | | 4/2005 | Lee et al. |
| 2005/0156496 | A1 | | 7/2005 | Takashima et al. |
| 2005/0179130 | A1 | | 8/2005 | Tanaka et al. |

(Continued)

FOREIGN PATENT DOCUMENTS
EP 1 296 363 A1 3/2003
(Continued)

*Primary Examiner* — N Drew Richards
*Assistant Examiner* — Kyoung Lee
(74) *Attorney, Agent, or Firm* — Sughrue Mion, PLLC

(57) ABSTRACT

A method for producing a gallium nitride based compound semiconductor light emitting device which is excellent in terms of the light emitting properties and the light emission efficiency and a lamp is provided. In such a method for producing a gallium nitride based compound semiconductor light emitting device, which is a method for producing a GaN based semiconductor light emitting device having at least a buffer layer, an n-type semiconductor layer, a light emitting layer, and a p-type semiconductor layer on a translucent substrate, on which an uneven pattern composed of a convex shape and a concave shape is formed, the buffer layer is formed by a sputtering method conducted in an apparatus having a pivoted magnetron magnetic circuit and the buffer layer contains AlN, ZnO, Mg, or Hf.

12 Claims, 19 Drawing Sheets

U.S. PATENT DOCUMENTS

| | | | |
|---|---|---|---|
| 2005/0221521 A1* | 10/2005 | Lee et al. ..................... 438/29 |
| 2005/0274610 A1 | 12/2005 | Iseki | |
| 2006/0006408 A1 | 1/2006 | Suehiro et al. | |
| 2006/0221634 A1* | 10/2006 | Sato et al. ..................... 362/611 |

FOREIGN PATENT DOCUMENTS

| | | | |
|---|---|---|---|
| JP | 60-173829 A | 9/1985 |
| JP | 06-291368 A | 10/1994 |
| JP | 2836687 B2 | 10/1998 |
| JP | 11-312825 A | 11/1999 |
| JP | 2001-107233 A | 4/2001 |
| JP | 2004-273122 A | 9/2004 |
| JP | 2004-339547 A | 12/2004 |
| JP | 2005-064492 A | 3/2005 |
| JP | 2005-101566 A | 4/2005 |
| JP | 2005-314121 A | 11/2005 |
| JP | 2005-336520 A | 12/2005 |
| JP | 2005-340748 A | 12/2005 |
| JP | 2005-347700 A | 12/2005 |
| JP | 2006-002244 A | 1/2006 |
| JP | 2006-036561 A | 2/2006 |

* cited by examiner

GAN BASED SEMICONDUCTOR LIGHT EMITTING DEVICE AND LAMP

TECHNICAL FIELD

The present invention relates to a light emitting device, and in particular relates to a method for producing a light emitting device that is highly reliable and has excellent light emission efficiency and a lamp that includes the light emitting device produced by employing the method.

Priority is claimed on Japanese Patent Application No. 2006-096340, filed Mar. 31, 2006, the content of which is incorporated herein by reference.

BACKGROUND ART

In recent years, a gallium nitride (GaN) based compound semiconductor material which is a nitride based semiconductor has been attracting attention as a semiconductor material for short wavelength light emitting devices. The GaN based compound semiconductor is formed on substrates made of various oxides or group III-V compounds, such as a sapphire single crystal, using a method such as the metal organic chemical vapor deposition method (MOCVD method) and the molecular beam epitaxial method (MBE method).

A common GaN based compound semiconductor light emitting device is configured so that an n-type semiconductor layer, a light emitting layer, and a p-type semiconductor layer are laminated in this order when a sapphire single crystal is used as a substrate. Since the sapphire substrate is an insulator, the structure of a device using the substrate will generally be a structure, as shown in FIG. 1, where a positive electrode formed on a p-type semiconductor layer and a negative electrode formed on an n-type semiconductor layer are present on the same plane. In such GaN based compound semiconductor light emitting devices, there are two kinds of devices, that is, a face up type device, in which light is emitted from the p-type semiconductor by using a transparent electrode as a positive electrode, and a flip chip type device in which light is emitted from the sapphire substrate by using a highly reflective film made of Ag or the like as a positive electrode.

When forming a transparent electrode on the p-type semiconductor, a metallic transparent electrode made of Ni/Au or the like has been used conventionally. However, in order to improve the light emission efficiency of light emitting devices, a translucent conductive oxide film made of ITO or the like has been developed on an industrial level in recent years and its use has been encouraged.

The external quantum efficiency is used as an indicator for the improvements in the output of such light emitting devices. When this external quantum efficiency is high, it is possible to say that the light emitting device has a high output.

The external quantum efficiency is represented as the product of internal quantum efficiency and light emission efficiency. The internal quantum efficiency refers to the ratio at which the energy of an electric current applied to the device is converted to light. On the other hand, the light emission efficiency refers to the ratio at which light generated inside a semiconductor crystal is emitted to the outside.

There are mainly two ways to improve the light emission efficiency. One is a method to reduce the absorption of emitted light by the electrodes, protective films, and the like formed on the light emitting surface. Another is a method to reduce the reflection loss which occurs in the interfaces between the materials having different refractive indices such as a compound semiconductor, an electrode, and a protective film.

Incidentally, one of the reason the metallic transparent electrodes made of Ni/Au or the like have been replaced by the translucent conductive oxide films made of ITO or the like is that the absorption of emitted light can be reduced by the use of translucent conductive oxide films.

Examples of the methods for reducing the reflection loss that occurs in the interfaces between the materials having different refractive indices include a technique that forms an uneven pattern composed of a convex shape or a concave shape on the light emitting surface. As an example where the method of forming an uneven pattern composed of a convex shape or a concave shape is applied, a light emitting device in which a compound semiconductor itself is subjected to processing for forming uneven patterns composed of a convex shape or a concave shape has been proposed (for example, refer to Patent Document 1).

However, in the light emitting device disclosed in Patent Document 1, since a semiconductor material is processed, a large load is applied to the semiconductor layer, and the semiconductor layer is greatly damaged. For this reason, although the light emission efficiency improves, the internal quantum efficiency reduces, and thus it is impossible to increase the light emission intensity, which is a problem.

A method has been proposed in which an uneven pattern composed of a convex shape or a concave shape is formed on a sapphire substrate instead of a compound semiconductor itself, and by growing a compound semiconductor on the substrate, the uneven pattern composed of a convex shape or a concave shape is formed on the compound semiconductor as a result, which leads to improvements in the light emission efficiency (for example, refer to Patent Document 2).

However, in the light emitting device disclosed in Patent Document 2, since an uneven pattern composed of a convex shape or a concave shape is formed on a sapphire substrate, the growth degree of a buffer layer to be formed thereafter varies. Accordingly, it is difficult to grow a compound semiconductor stably, which is a problem.

[Patent Document 1] Japanese Patent Publication No. 2836687

[Patent Document 2] Japanese Unexamined Patent Application, First Publication No. 2005-64492

DISCLOSURE OF THE INVENTION

Problems to be Solved by the Invention

The present invention is made in view of the abovementioned problems and its object is to provide a method for producing a light emitting device that has excellent light emitting properties and light emission efficiency and a lamp thereof by stably forming a buffer layer on a sapphire substrate, in which an uneven pattern composed of a convex shape or a concave shape is formed, so as to improve the crystallinity of a GaN based semiconductor layer to be grown thereon.

Means for Solving the Problem

The present inventors completed the present invention as a result of intensive studies in order to solve the above problems.

That is, the present invention relates to the following.

A first aspect of the present invention is a method for producing a GaN based semiconductor light emitting device having at least a buffer layer, an n-type semiconductor layer, a light emitting layer, and a p-type semiconductor layer on a translucent substrate, on which an uneven pattern composed of a convex shape or a concave shape is formed, characterized by including a step for forming the buffer layer by a sputtering method.

A second aspect of the present invention is the method for producing a GaN based semiconductor light emitting device according to the above first aspect characterized in that the sputtering method is conducted in an apparatus having a pivoted magnetron magnetic circuit.

A third aspect of the present invention is the method for producing a GaN based semiconductor light emitting device according to the above first aspect or second aspect characterized in that the buffer layer contains AlN, ZnO, Mg, or Hf.

A fourth aspect of the method for producing a GaN based semiconductor light emitting device according to the above first aspect or second aspect characterized in that the buffer layer contains AlN.

A fifth aspect of the present invention is the method for producing a GaN based semiconductor light emitting device according to any one of the above first aspect to fourth aspect characterized in that the translucent substrate is a sapphire single crystal.

A sixth aspect of the present invention is the method for producing a GaN based semiconductor light emitting device according to any one of the above first aspect to fifth aspect characterized in that the convex shape is a truncated cone and the height of the truncated cone is greater than a bottom diameter of the truncated cone.

A seventh aspect of the present invention is the method for producing a GaN based semiconductor light emitting device according to any one of the above first aspect to fifth aspect characterized in that the convex shape is a truncated polygonal pyramid such as a truncated triangular pyramid, a truncated quadrangular pyramid, a truncated pentagonal pyramid, or a truncated hexagonal pyramid, and the height of the truncated polygonal pyramid is greater than a diagonal line of the bottom of the truncated polygonal pyramid.

An eighth aspect of the present invention is the method for producing a GaN based semiconductor light emitting device according to any one of the above first aspect to fifth aspect characterized in that the convex shape is a circular cone and the height of the circular cone is greater than the bottom diameter of the circular cone.

A ninth aspect of the present invention is the method for producing a GaN based semiconductor light emitting device according to any one of the above first aspect to fifth aspect characterized in that the convex shape is a polygonal pyramid such as a triangular pyramid, a quadrangular pyramid, a pentagonal pyramid, and a hexagonal pyramid, and the height of the polygonal pyramid is greater than a diagonal line of the bottom of the polygonal pyramid.

A tenth aspect of the present invention is the method for producing a GaN based semiconductor light emitting device according to any one of the above first aspect to fifth aspect characterized in that the convex shape is a circular cylinder and the height of the circular cylinder is greater than the bottom diameter of the circular cylinder.

An eleventh aspect of the present invention is the method for producing a GaN based semiconductor light emitting device according to any one of the above first aspect to fifth aspect characterized in that the convex shape is a polygonal prism such as a triangular prism, a quadrangular prism, a pentagonal prism, and a hexagonal prism, and the height of the polygonal prism is greater than a diagonal line of a bottom of the polygonal prism.

A twelfth aspect of the present invention is the method for producing a GaN based semiconductor light emitting device according to any one of the above first aspect to fifth aspect characterized in that the concave shape is a truncated cone, and a depth of the truncated cone is greater than the diameter of the top of the truncated cone and the diameter of the top surface of the truncated cone.

A thirteenth aspect of the present invention is the method for producing a GaN based semiconductor light emitting device according to any one of the above first aspect to fifth aspect characterized in that the concave shape is a truncated polygonal pyramid such as a truncated triangular pyramid, a truncated quadrangular pyramid, a truncated pentagonal pyramid, or a truncated hexagonal pyramid, and the depth of the truncated polygonal pyramid is greater than a diagonal line of the top of the truncated polygonal pyramid.

A fourteenth aspect of the present invention is the method for producing a GaN based semiconductor light emitting device according to any one of the above first aspect to fifth aspect characterized in that the concave shape is a circular cone, and the depth of the circular cone is greater than the diameter of the top of the circular cone.

A fifteenth aspect of the present invention is the method for producing a GaN based semiconductor light emitting device according to any one of the above first aspect to fifth aspect characterized in that the concave shape is a polygonal pyramid such as a triangular pyramid, a quadrangular pyramid, a pentagonal pyramid, or a hexagonal pyramid, and the depth of the polygonal pyramid is greater than a diagonal line of the top of the polygonal pyramid.

A sixteenth aspect of the present invention is the method for producing a GaN based semiconductor light emitting device according to any one of the above first aspect to fifth aspect characterized in that the concave shape is a circular cylinder, and a depth of the circular cylinder is greater than a diameter of a top of the circular cylinder.

A seventeenth aspect of the present invention is the method for producing a GaN based semiconductor light emitting device according to any one of the above first aspect to fifth aspect characterized in that the concave shape is a polygonal prism such as a triangular prism, a quadrangular prism, a pentagonal prism, and a hexagonal prism, and the depth of the polygonal prism is greater than a diagonal line of the top of the polygonal prism.

An eighteenth aspect of the present invention is the method for producing a GaN based semiconductor light emitting device according to any one of the above first aspect to fifth aspect characterized in that the concave shape is a stripe-shaped groove, and the depth of the groove is greater than the width of the groove.

A nineteenth aspect of the present invention is a lamp including a light emitting device produced using a method for producing a GaN based semiconductor light emitting device according to any one of the above first aspect to eighteenth aspect.

Effects of the Invention

According to the light emitting device of the present invention, it is possible to stably form a buffer layer since the buffer layer is formed on a sapphire substrate, in which an uneven pattern composed of a convex shape or a concave shape is formed, by a sputtering method. Moreover, it is possible to form the buffer layer even more stably when an apparatus used in the sputtering method is equipped with a pivoted magnetron magnetic circuit.

By stably forming a buffer layer, it will be possible to grow a GaN based semiconductor layer having high crystallinity, and thus it will be possible to form a GaN based semiconductor layer that includes a light emitting layer with excellent light emitting properties.

Therefore, a light emitting device which is excellent in terms of the light emitting properties of the light emitting layer and the light emission efficiency is obtained.

In addition, according to the method for producing a light emitting device of the present invention, it will be possible to produce a light emitting device which is excellent in terms of the light emitting properties of the light emitting layer and the light emission efficiency due to the configurations described above.

In addition, the lamp of the present invention has excellent light emitting properties since the light emitting device of the present invention is used therein.

BEST MODE FOR CARRYING OUT THE INVENTION

One embodiment of the light emitting device of the present invention and the lamp using the device will be described below while referring to FIGS. 1 to 5 where appropriate.

Note that the present invention is not limited to each element of the following embodiment and, for example, constituting elements in this embodiment may be combined where appropriate.

[Overall Configuration of Light Emitting Device]

Figure 1:
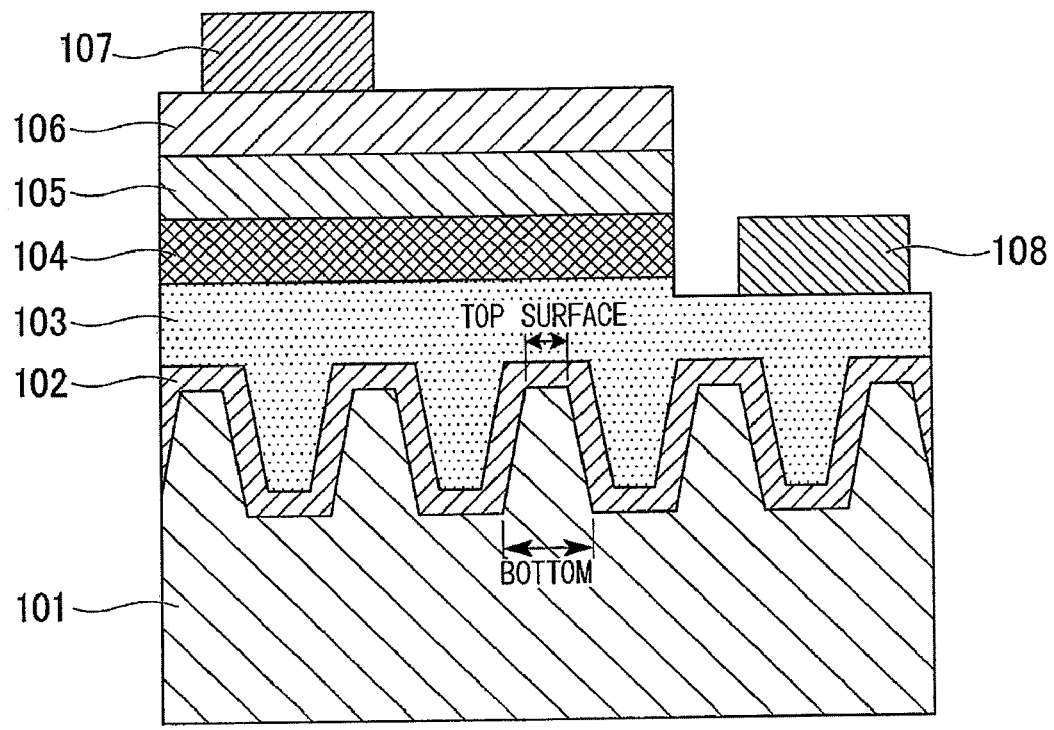
FIG. 1 is a diagram schematically showing a cross section of a light emitting device of the present invention.
Figure 2:
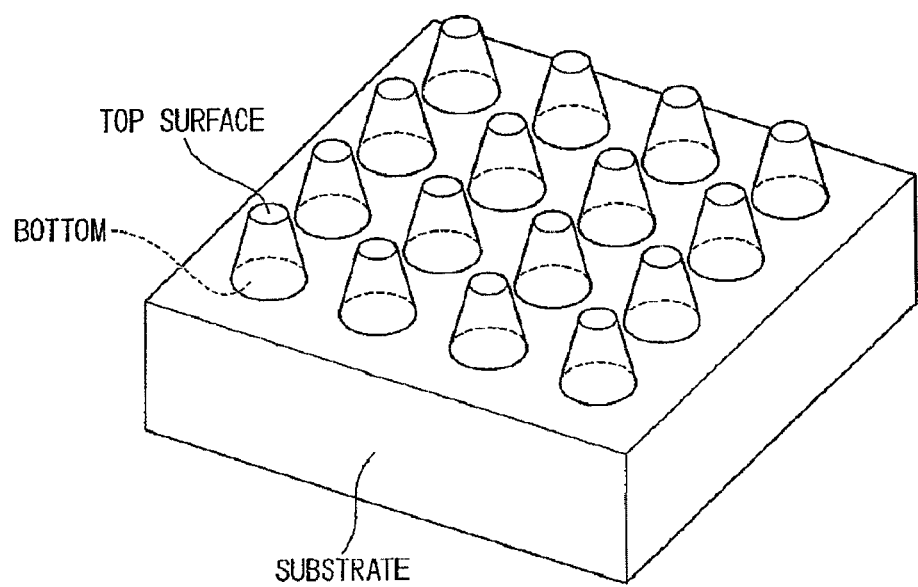
FIG. 2 shows an example where a convex portion is formed on a substrate using a nanoimprint process.
Figure 3:
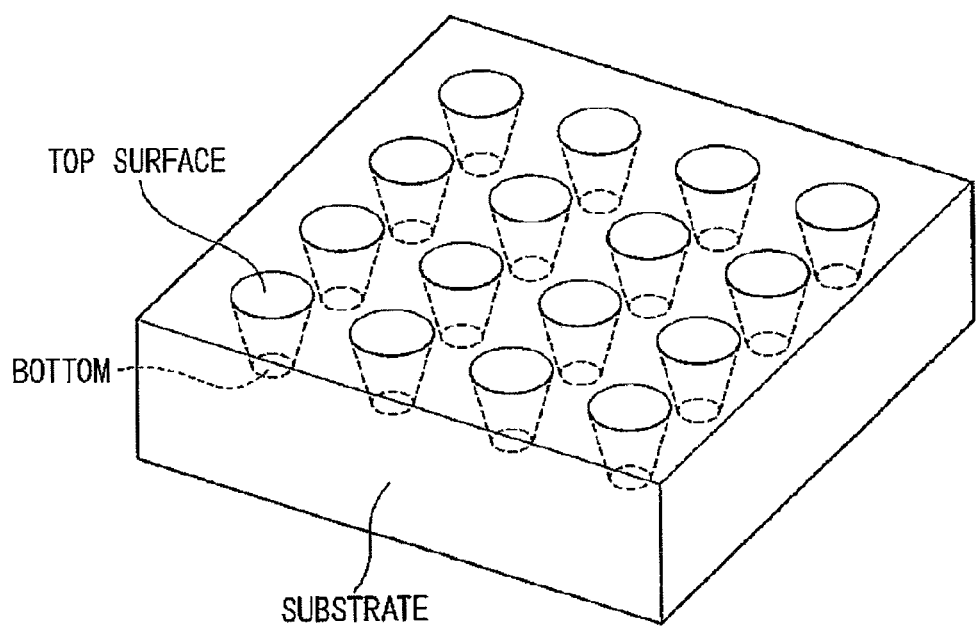
FIG. 3 shows an example where a concave portion is formed on a substrate using a nanoimprint process.

FIG. 1 is a diagram schematically showing a cross section of a light emitting device of the present invention.

In FIG. 1, the reference numerals 101, 102, 103, 104, 105, 106, 107, and 108 show a substrate, a buffer layer, an n-type semiconductor layer, a light emitting layer, a p-type semiconductor layer, a transparent electrode, a positive electrode, and a negative electrode, respectively.

(Substrate) As the substrate 101, known substrate materials including oxide single crystals such as a sapphire single crystal ($Al_2O_3$; A-plane, C-plane, M-plane, and R-plane), a spinel single crystal ($MgAl_2O_4$), a ZnO single crystal, a $LiAlO_2$ single crystal, a $LiGaO_2$ single crystal or a MgO single crystal, a Si single crystal, a SiC single crystal, a GaAs single crystal, an AlN single crystal, a GaN single crystal, and boride single crystals such as a $ZrB_2$ single crystal may be used. Also in the present invention, any translucent substrate materials including these known substrate materials can be used without any limitations. Among these, a sapphire single crystal is preferable. Note that the plane direction of the substrate 101 is not particularly limited. In addition, the substrate may be a just substrate or a substrate having an off angle.

It should be noted that the term "translucent" used in the present invention refers to a state where a material transmits light emitted from the GaN based semiconductor light emitting device, that is, the material may have a transmittance of 70% or more for light having wavelengths between 400 nm and 600 nm.

(Method for Processing Sapphire Substrate)

As a method for forming a periodic uneven pattern composed of a convex shape or a concave shape on a sapphire substrate, a known photolithography method may be used. Moreover, it is also possible to employ a nanoimprint process.

When a nanoimprint process is employed, a mask made of nickel or the like is used, and a resist is coated on this mask and is then transferred to the surface of a titanium oxide based conductive film by pressing the resist-coated side of the mask thereto. The steps which follow thereafter are the same as those in the known photolithography method.

It should be noted that the damage made on the mask may become a problem in some cases when the abovementioned nanoimprint process is employed since the mask coated with a resist is pressed directly on the sapphire substrate. In order to avoid this problem, it is effective to produce a replica from the mask using water-soluble resin such as polyvinyl alcohol (PVA), coat a resist on this replica, and then transfer the resin to the surface of the titanium oxide based conductive film by pressing the replica thereto. The mask will not be damaged by this procedure since the resist is not transferred directly from the mask. In addition, since PVA is resin, very little damage is made on the mask while producing a mask replica. Moreover, although a mask replica can be used only once, the mass production thereof will not be a problem due to the low cost of PVA. Furthermore, since the mask replica is water-soluble, it can readily be removed by water after transferring the resist.

In terms of the shape which forms an uneven pattern, there are mainly a convex shape (shown in FIG. 2) and a concave shape (shown in FIG. 3), and either can be used.

The shape of the convex portion is not particularly limited and examples thereof shown in FIGS. 2 and 7-20 include a circular cylinder, polygonal prisms such as a triangular prism, a quadrangular prism, a pentagonal prism, and a hexagonal prism, a circular cone, polygonal pyramids such as a triangular pyramid, a quadrangular pyramid, a pentagonal pyramid, and a hexagonal pyramid, a truncated cone, and truncated polygonal pyramids such as a truncated triangular pyramid, a truncated quadrangular pyramid, a truncated pentagonal pyramid, and a truncated hexagonal pyramid. The shape may be selected appropriately. In addition, in the cross sectional view of the light emitting device 1 shown in FIG. 1, it is preferable that the width dimension of the bottom of the convex portion in the substrate be greater than or equal to that of the top thereof.

Moreover, there are no limitations on the size of the convex portion. However, it is preferable that the diameter of the bottom surface of the convex portion or the length of the diagonal line thereof be within the range of 0.1 μm to 10 μm.

Although it is possible to form the convex portion so that the diameter of the bottom of the convex portion or the length of the diagonal line thereof is less than 0.1 μm by employing a photolithography method, this process involves a high cost. Moreover, since the size of the light emitting device is generally in the range of 100 μm to 2,000 μm, when the diameter of the bottom of the convex portion or the length of the diagonal line thereof is greater than 10 μm, the convex portion will be too large to achieve satisfactory light emission efficiency. It is more preferable that the diameter of the bottom of the convex portion or the length of the diagonal line thereof be within the range of 0.1 µm to 2 µm.

Although the interval between the adjacent convex portions is not particularly limited as long as it is periodic, it is preferably within the range of 0.1 µm to 10 µm.

Although it is possible to form the convex portions so that the interval between the adjacent convex portions is less than 0.1 µm by employing a photolithography method, this process involves a high cost. Moreover, since the size of the light emitting device is generally in the range of 100 µm to 2,000 µm when the interval between the adjacent convex portions is greater than 10 µm, the interval will be too large to achieve satisfactory light emission efficiency. It is more preferable that the interval between the adjacent convex portions be within the range of 0.1 µm to 2 µm.

Although the height of the convex portion is not particularly limited, it is preferably within the range of 0.1 µm to 2.0 µm.

When the height of the convex portion is less than 0.1 µm, the height is not satisfactory for the convex portion to contribute to the improvements in the light emission efficiency. On the other hand, when the height of the convex portion is greater than 2.0 µm, the height is inadequate since the productivity drops considerably, although the convex portion does contribute to improvements in the light emission efficiency.

Moreover, it is more preferable that the size of the convex portion satisfies the following relationship; i.e., (diameter of the bottom of the convex portion or the length of the diagonal line thereof)<(height of the convex portion). The convex portion having a size that satisfies the above relationship makes it possible to effectively improve the light emission efficiency even further.

More specifically, when the shape of the convex is a truncated cone, it is preferable that the height of the truncated cone be greater than the diameter of the bottom of the truncated cone.

When the shape of the convex is a truncated polygonal pyramid such as a truncated triangular pyramid, a truncated quadrangular pyramid, a truncated pentagonal pyramid, or a truncated hexagonal pyramid, it is preferable that the height of the truncated polygonal pyramid be greater than the diagonal line of the bottom of the truncated polygonal pyramid.

When the shape of the convex is a circular cone, it is preferable that the height of the circular cone be greater than the diameter of the bottom of the circular cone.

When the shape of the convex is a polygonal pyramid such as a triangular pyramid, a quadrangular pyramid, a pentagonal pyramid, or a hexagonal pyramid, it is preferable that the height of the polygonal pyramid be greater than the diagonal line of the bottom of the polygonal pyramid.

When the shape of the convex is a circular cylinder, it is preferable that the height of the circular cylinder be greater than the diameter of the bottom of the circular cylinder.

When the shape of the convex is a polygonal prism such as a triangular prism, a quadrangular prism, a pentagonal prism, or a hexagonal prism, it is preferable that the height of the polygonal prism be greater than the diagonal line of the bottom of the polygonal prism.

When the shape of the convex is a stripe-shaped groove, it is preferable that the depth of the groove be greater than the width of the groove.

The shape of the concave portion is not particularly limited and examples thereof shown in FIGS. 3 and 21-35 include a circular cylinder, polygonal prisms such as a triangular prism, a quadrangular prism, a pentagonal prism, or a hexagonal prism, a circular cone, polygonal pyramids such as a triangular pyramid, a quadrangular pyramid, a pentagonal pyramid, or a hexagonal pyramid, a truncated cone, and truncated polygonal pyramids such as a truncated triangular pyramid, a truncated quadrangular pyramid, a truncated pentagonal pyramid, or a truncated hexagonal pyramid. The shape may be selected appropriately. In addition, in the cross sectional view of the light emitting device 1 shown in FIG. 1, it is preferable that the width dimension of the top of the concave portion in the substrate be greater than or equal to that of the bottom thereof.

Moreover, there are no limitations on the size of the concave portion. However, it is preferable that the diameter of the top of the concave portion or the length of the diagonal line thereof be within the range of 0.1 µm to 10 µm.

Although it is possible to form the concave portion so that the diameter of the bottom surface of the concave portion or the length of the diagonal line thereof is less than 0.1 µm by employing a photolithography method, this process involves a high cost. Moreover, since the size of the light emitting device is generally in the range of 100 µm to 2,000 µm, when the diameter of the top of the concave portion or the length of the diagonal line thereof is greater than 10 µm, the concave portion will be too large to achieve satisfactory light emission efficiency. It is more preferable that the diameter of the top of the concave portion or the length of the diagonal line thereof be within the range of 0.1 µm to 2 µm.

Although the interval between the adjacent concave portions is not particularly limited as long as it is periodic, it is preferably within the range of 0.1 µm to 10 µm.

Although it is possible to form the concave portions so that the interval between the adjacent concave portions is less than 0.1 µm by employing a photolithography method, this process involves a high cost. Moreover, since the size of the light emitting device is generally in the range of 100 µm to 2,000 µm, when the interval between the adjacent concave portions is greater than 10 µm, the interval will be too large to achieve satisfactory light emission efficiency. It is more preferable that the interval between the adjacent concave portions be within the range of 0.1 µm to 2 µm.

Although the depth of the concave portion is not particularly limited, it is preferably within the range of 0.1 µm to 2.0 µm.

When the depth of the concave portion is less than 0.1 µm, the depth is not satisfactory for the concave portion to contribute to the improvements in the light emission efficiency. On the other hand, when the depth of the concave portion is greater than 2.0 µm, the depth is inadequate since the productivity drops considerably, although the concave portion does contribute to the improvements in the light emission efficiency.

Moreover, it is more preferable that the size of the concave portion satisfies the following relationship; i.e., (diameter of the top of the concave portion or the length of the diagonal line thereof)<(depth of the concave portion). The concave portion having a size that satisfies the above relationship makes it possible to effectively improve the light emission efficiency even further.

More specifically, when the shape of the concave is a truncated cone, it is preferable that the depth of the truncated cone be greater than the diameter of the top of the truncated cone and the diameter of the top surface of the truncated cone.

When the shape of the concave is a truncated polygonal pyramid such as a truncated triangular pyramid, a truncated quadrangular pyramid, a truncated pentagonal pyramid, or a truncated hexagonal pyramid, it is preferable that the depth of the truncated polygonal pyramid be greater than the diagonal line of the top of the truncated polygonal pyramid.

When the shape of the concave is a circular cone, it is preferable that the depth of the circular cone be greater than the diameter of the top of the circular cone.

When the shape of the concave is a polygonal pyramid such as a triangular pyramid, a quadrangular pyramid, a pentagonal pyramid, or a hexagonal pyramid, it is preferable that the depth of the polygonal pyramid be greater than the diagonal line of the top of the polygonal pyramid.

When the shape of the concave is a circular cylinder, it is preferable that the depth of the circular cylinder be greater than the diameter of the top of the circular cylinder.

When the shape of the concave is a polygonal prism such as a triangular prism, a quadrangular prism, a pentagonal prism, or a hexagonal prism, it is preferable that the depth of the polygonal prism be greater than the diagonal line of the top of the polygonal prism.

When the shape of the concave is a stripe-shaped groove, it is preferable that the depth of the groove be greater than the width of the groove.

(Sputtering Method)

The buffer layer is generally formed by the metalorganic chemical vapor deposition (MOCVD) method. However, when an uneven pattern composed of a convex shape or a concave shape is formed on the substrate, it is difficult to stably form the buffer layer since the flow rate of the metalorganic (MO) gas is disturbed on the substrate surface. In particular, when the relationship, that is, (diameter of the bottom of the convex portion or the length of the diagonal line thereof)<(height of the convex portion) is satisfied, it will be even more difficult to stably form the buffer layer down to the bottom surface of the convex portion.

In the sputtering method, since sputtered particles are highly progressive, the buffer layer can be formed without particularly being affected by the uneven pattern composed of a convex shape or a concave shape. Moreover, the sputtering method employing an apparatus equipped with a pivoted magnetron magnetic circuit is more preferable. A magnetron magnetic circuit 202, for example, includes a magnet 201 which generates a magnetic field above a target 203. When a magnetic field is generated above the target 203, sputtered particles 204 are a distributed from the target 203 toward a surface to be coated (e.g., substrate 101) in a plurality of directions 205.

Figure 4:
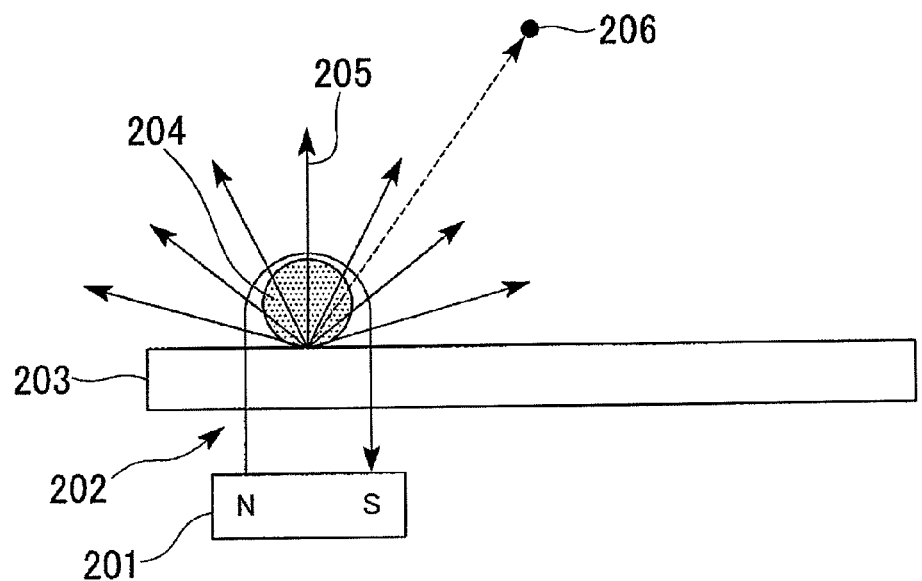
FIG. 4 shows an example of the motions of sputtered particles in a sputtering apparatus employing a fixed magnetron magnetic circuit.
Figure 5:
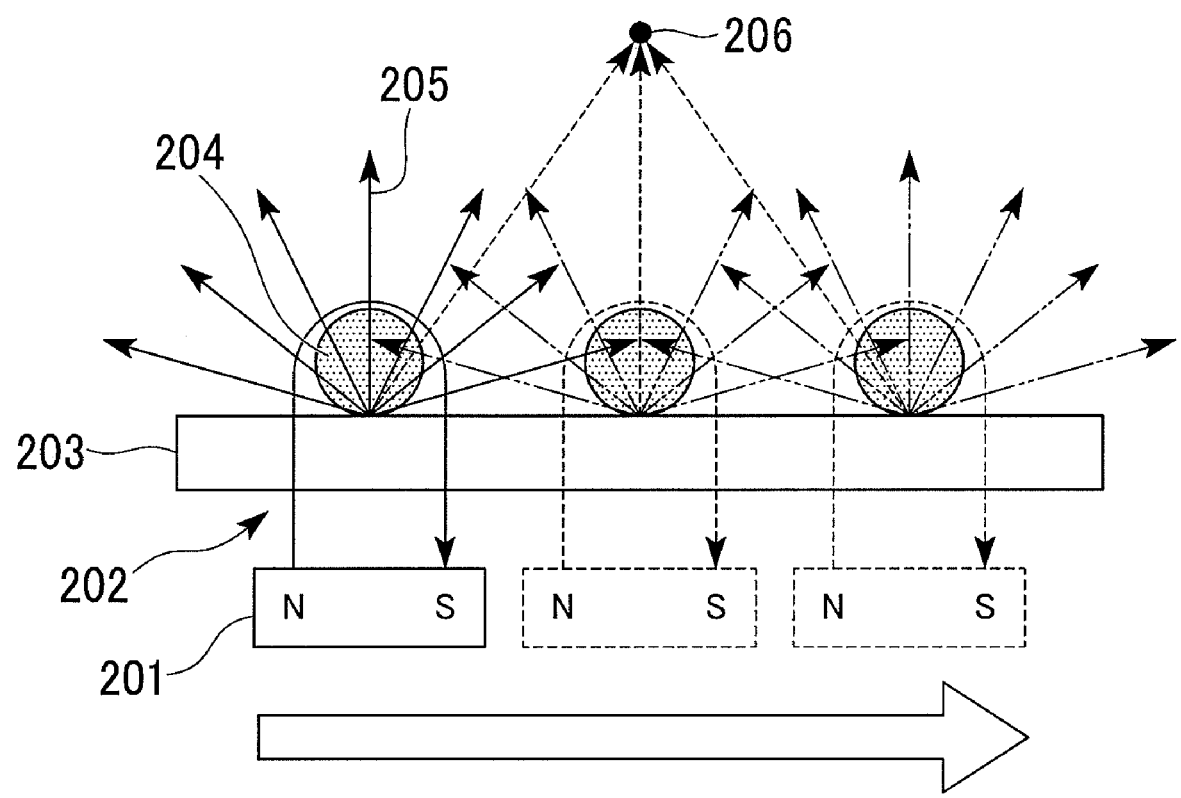
FIG. 5 shows an example of the motions of sputtered particles in a sputtering apparatus employing a pivoted magnetron magnetic circuit.

The principle of the sputtering method will be described using FIGS. 4 and 5. Since the uneven pattern composed of a convex shape or a concave shape is extremely small, it is dealt as a point 206 in the present description. When a magnetron magnetic circuit 202 is a fixed type as shown in FIG. 4, the direction of the sputtered particles 204 entering into the uneven pattern 206 composed of a convex shape or a concave shape is limited to only one direction. On the other hand, when a magnetron magnetic circuit is a pivoted type as shown in FIG. 5, the sputtered particles 204 entering into the uneven pattern 206 composed of a convex shape or a concave shape can be directed in a variety of directions. If the sputtered particles 204 enter only from one direction, it is inevitable that some parts will be shaded when the uneven pattern composed of a convex shape or a concave shape is present, creating some regions where no film is formed. On the other hand, when the sputtered particles 204 are entering from various directions, shaded parts are unlikely to be formed and it will be possible to form a film all over the surface throughout the uneven pattern composed of a convex shape or a concave shape.

Although a pivoted magnetron magnetic circuit 202 is capable of any movement, it is preferable that the pivoted magnetron magnetic circuit 202 be moved in parallel with respect to the target 203. In order to maintain a uniform film thickness, it is preferable that the movement be a reciprocating movement. The movement speed may be constant. Moreover, when the movement speed is slow at the end of the reciprocating movement and is fastest at the center of the reciprocating movement based on a simple harmonic oscillating mechanism, it is possible to achieve an even more uniform film thickness.

The film can be formed by employing either direct current (DC) or radio frequency (RF). When forming an AlN layer, it can be formed by employing RF while using an AlN target or by a reactive sputtering method in an $N_2$ atmosphere using an Al target. Although the reactive sputtering method can employ either RF or DC, since it is possible that insulating deposits attach onto the target 203 to cause an abnormal electrical discharge, the employment of RF is more preferable.

(GaN layer) An n-type semiconductor layer, a light emitting layer, and a p-type semiconductor layer, each composed of a GaN based semiconductor, are usually laminated on a substrate 101 with a GaN layer 102 serving as a buffer layer interposed therebetween. In the present invention, the buffer layer is formed by the sputtering method.

Various kinds of GaN based semiconductors have been known which are represented by a general formula $Al_XGa_YIn_ZN_{1-A}M_A$ ($0 \leq X \leq 1$, $0 \leq T \leq 1$, $0 \leq Z \leq 1$, as well as $X+Y+Z=1$, and the symbol M represents a group V element different from nitrogen (N) and $0 \leq A < 1$). The present invention can also use any kind of GaN based semiconductor represented by the general formula $Al_XGa_YIn_ZN_{1-A}M_A$ ($0 \leq x \leq 1$, $0 \leq Y \leq 1$, $0 \leq Z \leq 1$, as well as $X+Y+Z=1$, and the symbol M represents a group V element different from nitrogen (N) and $0 \leq A < 1$) including those already known GaN based semiconductors. The GaN based semiconductor may include group III elements other than Al, Ga, and In, and it may also include elements, such as Ge, Si, Mg, Ca, Zn, Be, P, As, or B, if necessary. Moreover, the elements contained are not limited to those added intentionally and there are also cases where the semiconductor contains impurities that are inevitably contained depending on the film forming conditions and the like, as well as the trace impurities contained in the source materials and the reaction tube materials.

The method for growing GaN based semiconductor is not particularly limited and all the methods that are known to grow a GaN based semiconductor such as the metalorganic chemical vapor deposition (MOCVD) method, the hydride vapor phase epitaxy (HVPE) method, or the molecular beam epitaxy (MBE) method can be applied. The MOCVD method is preferable as the growing method in view of its film thickness controllability and mass productivity.

In the MOCVD method, hydrogen ($H_2$) or nitrogen ($N_2$) is used as a carrier gas; trimethylgallium (TMG) or triethylgallium (TEG) is used as a Ga source, trimethylaluminum (TMA) or triethylaluminum (TEA) is used as an Al source, trimethylindium (TMI) or triethylindium (TEI) is used as an In source, each of which is a group III material; and ammonium ($NH_3$) or hydrazine ($N_2H_4$) is used as a nitrogen (N) source, which is a group V material. In addition, as dopants in the n-type semiconductor, monosilane ($SiH_4$) or disilane ($Si_2H_6$) can be used as a Si source material, and germane gas ($GeH_4$) or organic germanium compounds such as tetramethylgermanium (($CH_3)_4Ge$) and tetraethylgermanium (($C_2H_5)_4Ge$) can be used as a Ge source material.

In the MBE method, elemental germanium can also be used as a doping source. For example, biscyclopentadienyl magnesium ($Cp_2Mg$) or bisethylcyclopentadienyl magnesium ($EtCp_2Mg$) is used as an Mg source material for the p-type semiconductor.

The n-type semiconductor layer 103 is usually configured from an underlying layer, an n-contact layer, and an n-cladding layer. The n-contact layer can also serve as an underlying layer and/or an n-cladding layer. The underlying layer is preferably constituted from an $Al_xGa_{1-x}N$ layer ($0 \leq x \leq 1$, preferably $0 \leq x \leq 0.5$ and more preferably $0 \leq x \leq 0.1$). Film thickness of the underlying layer is greater than or equal to 0.1 μm, preferably greater than or equal to 0.5 μm, and more preferably greater than or equal to 1 μm. The $Al_xGa_{1-x}N$ layer with satisfactory crystallinity is likely to be obtained by making the film thickness greater than or equal to the above range.

The underlying layer may be doped with an n-type impurity within the range of $1 \times 10^{17}$ to $1 \times 10^{19}/cm^3$ if required. However, it is preferable that the underlying layer be undoped ($<1 \times 10^{17}/cm^3$) in view of the maintenance of satisfactory crystallinity. Although n-type impurities are not particularly limited, examples thereof include Si, Ge, and Sn and Si and Ge are preferable.

Growth temperature for growing the underlying layer is preferably 800 to 1,200° C. and it is more preferable to adjust it within the range of 1,000 to 1,200° C. The underlying layer with satisfactory crystallinity is obtained when it is grown within this growth temperature range. In addition, the pressure inside the MOCVD growth furnace is adjusted within the range of 15 to 40 kPa.

Similar to the underlying layer, the n-contact layer is preferably constituted from an $Al_xGa_{1-x}N$ layer ($0 \leq X \leq 1$, preferably $0 \leq X \leq 0.5$ and more preferably $0 \leq X \leq 0.1$). In addition, it is preferable that n-type impurities are doped in the n-contact layer and it is preferable for the n-contact layer to contain n-type impurities within a concentration range of $1 \times 10^{17}$ to $1 \times 10^{19}/cm^3$, more preferably $1 \times 10^{18}$ to $1 \times 10^{19}/cm^3$ for maintaining a satisfactory ohmic contact with the negative electrode, suppressing the generation of cracks, and maintaining satisfactory crystallinity. Although n-type impurities are not particularly limited, examples thereof include Si, Ge, Sn, Si and Ge are preferable. A preferable range of the growth temperature for the n-contact layer is the same as that of the underlying layer.

It is preferable that the GaN based semiconductor constituting the n-contact layer has the same composition as that of the underlying layer and it is preferable to set the sum of the thicknesses of the n-contact layer and the underlying layer within the range of 1 to 20 μm, more preferably 2 to 15 μm, and even more preferably 3 to 12 μm. The crystallinity of the semiconductor is satisfactorily maintained when the sum of the film thicknesses of the n-contact layer and the underlying layer is within the above-mentioned range.

It is preferable to provide an n-cladding layer between the n-contact layer and the light emitting layer 104. This is because by doing so, the deteriorations in the smoothness occurring on the surface of the n-contact layer can be alleviated. The n-cladding layer can be formed with AlGaN, GaN, GaInN, or the like. In addition, it is also possible to configure a heterojunction of these structures or a superlattice structure where these structures are laminated several times. Needless to say, when forming the n-cladding layer with GaInN, it is desirable that its bandgap is larger than that of GaInN in the light emitting layer 104.

Although the film thickness of the n-cladding layer is not particularly limited, it is preferably within the range of 0.005 to 0.5 μm and more preferably within the range of 0.005 to 0.1 μm. The n-type dopant concentration in the n-cladding layer is preferably within the range of $1 \times 10^{17}$ to $1 \times 10^{20}/cm^3$ and more preferably within the range of $1 \times 10^{18}$ to $1 \times 10^{19}/cm^3$. It is preferable that the dopant concentration be within this range for maintaining satisfactory crystallinity and for reducing the operating voltage of the device.

A light emitting layer 104 constituted of a GaN based semiconductor, preferably a GaN based semiconductor made of $Ga_{1-s}In_sN$ ($0<S<0.4$) is usually used as the light emitting layer that is laminated on the n-type semiconductor layer 103 in the present invention. Although the film thickness of the light emitting layer 104 is not particularly limited, examples thereof include a film thickness where the quantum effect is achieved, that is, the critical film thickness and, for example, it is preferably within the range of 1 to 10 nm, and more preferably within the range of 2 to 6 nm. It is preferable that the film thickness of the light emitting layer be within the above range from a viewpoint of emission power.

In addition, apart from the abovementioned single quantum well (SQW) structure, the light emitting layer may also be configured as a multiple quantum well (MQW) structure constituted from the abovementioned $Ga_{1-s}In_sN$ layer as a well layer and an $Al_cGa_{1-c}N$ ($0 \leq c \leq 0.3$) barrier layer having a larger bandgap energy than that of the well layer. Moreover, the well layer and the barrier layer may be doped with impurities.

Growth temperature of the $Al_cGa_{1-c}N$ barrier layer is preferably greater than or equal to 700° C., and it is more preferable to grow the layer within a temperature range of 800 to 1,100° C. since satisfactory crystallinity is achieved. The GaInN well layer is grown within the range of 600 to 900° C., preferably 700 to 900° C. In other words, the growth temperature is preferably changed for different layers in order to achieve satisfactory crystallinity of the MQW structure.

The p-type semiconductor layer 105 is usually constituted from a p-cladding layer and a p-contact layer. However, the p-contact layer may also serve as the p-cladding layer.

The p-cladding layer is not particularly limited as long as it has a composition that has a higher bandgap energy than that of the light emitting layer 104 and it can confine carries in the light emitting layer, and preferable examples thereof include an $Al_dGa_{1-d}N$ ($0 \leq d \leq 0.4$, preferably $0.1 \leq d \leq 0.3$) layer. It is preferable that the p-cladding layer be formed from such an AlGaN layer from the viewpoint of the confinement of carriers in the light emitting layer 104. Although the film thickness of the p-cladding layer is not particularly limited, it is preferably within the range of 1 to 400 nm and more preferably within the range of 5 to 100 nm. The p-type dopant concentration in the p-cladding layer is preferably within the range of $1 \times 10^{18}$ to $1 \times 10^{21}/cm^3$ and more preferably within the range of $1 \times 10^{19}$ to $1 \times 10^{20}/cm^3$. Satisfactory p-type crystals are obtained without reducing the crystallinity thereof when the p-type dopant concentration is within the abovementioned range.

The p-contact layer is a GaN based semiconductor layer containing at least $Al_eGa_{1-e}N$ ($0 \leq e \leq 0.5$, preferably, $0 \leq e \leq 0.2$, more preferably, $0 \leq e \leq 0.1$). It is preferable that the Al composition be within the above range for maintaining satisfactory crystallinity and for satisfactory ohmic contact with a p-ohmic electrode. It is preferable that the p-type impurity (dopant) concentration be within the range of $1 \times 10^{18}$ to $1 \times 10^{21}/cm^3$ for maintaining a satisfactory ohmic contact, preventing the occurrence of cracks, and maintaining satisfactory crystallinity, and more preferably, the concentration is within the range of $5 \times 10^{19}$ to $5 \times 10^{20}/cm^3$. Although p-type impurities are not particularly limited, preferable examples thereof include Mg. Although the film thickness is not particularly limited, it is preferably be within the range of 0.01 to 0.5 μm and more preferably 0.05 to 0.2 μm. It is preferable that the film thickness be within this range from a viewpoint of emission power.

(Electrode)

The translucent positive electrode 106 is at least constituted from a translucent conductive oxide film that is in contact with a p-type semiconductor layer 105. A positive electrode bonding pad is formed on part of the translucent conductive oxide film layer for the electrical connection with a circuit board, a lead frame, or the like. The translucent positive electrode can be formed through a general means well known in this technical field using a material containing at least one of ITO ($In_2O_3$—$SnO_2$), AZnO (ZnO—$Al_2O_3$), IZnO ($In_2O_3$—ZnO), and GZO (ZnO—$Ga_2O_3$). Moreover, the translucent positive electrode can adopt any structure without any limitations including the structures already known.

The translucent positive electrode 106 may be formed so as to cover substantially the entire surface of the p-type semiconductor layer 105, or it may be formed in a lattice shape or a tree shape with gaps present. After the translucent positive electrode 106 is formed, a thermal annealing process may be conducted for alloying or increasing transparency, or it may not be conducted.

The positive electrode bonding pad is provided on the translucent positive electrode and as the materials for the positive electrode bonding pad, various structures using Au, Al, Ni, Cu, or the like are known and these known materials and structures can be used without any limitations.

It is preferable that the thickness of the positive electrode bonding pad be within the range of 100 to 1,000 nm. In addition, the bonding pad has characteristics that, as the thickness thereof increases, bondability is improved. Therefore, it is preferable that that thickness of the positive electrode bonding pad be greater than or equal to 300 nm. In addition, it is preferable that the thickness of the positive electrode bonding pad be equal to or less than 500 nm from the viewpoint of manufacturing cost.

The negative electrode bonding pad is formed so as to come into contact with the n-type semiconductor layer of the gallium nitride based compound semiconductor, which is a laminate of the n-type semiconductor layer 103, the light emitting layer 104, and the p-type semiconductor layer 105 sequentially formed on the substrate 101.

For this reason, when the negative electrode bonding pad is formed, the light emitting layer 104 and the p-type semiconductor layer 105 are partially removed to expose the n-contact layer of the n-type semiconductor layer 103, and the negative electrode bonding pad is formed on the exposed portion.

As the materials for the negative electrode bonding pad, negative electrodes having various compositions and structures are known and these known negative electrodes can be used without any limitations. They can be formed by a means that has been well known in this technical field.

(Description of Lamp)

The gallium nitride based compound semiconductor light emitting device of the present invention described so far can be used to form a lamp by providing a transparent cover due to, for example, a known means for those skilled in the art. In addition, it is also possible to form a white lamp by combining the gallium nitride based compound semiconductor light emitting device of the present invention with a cover including a phosphor.

Figure 6:
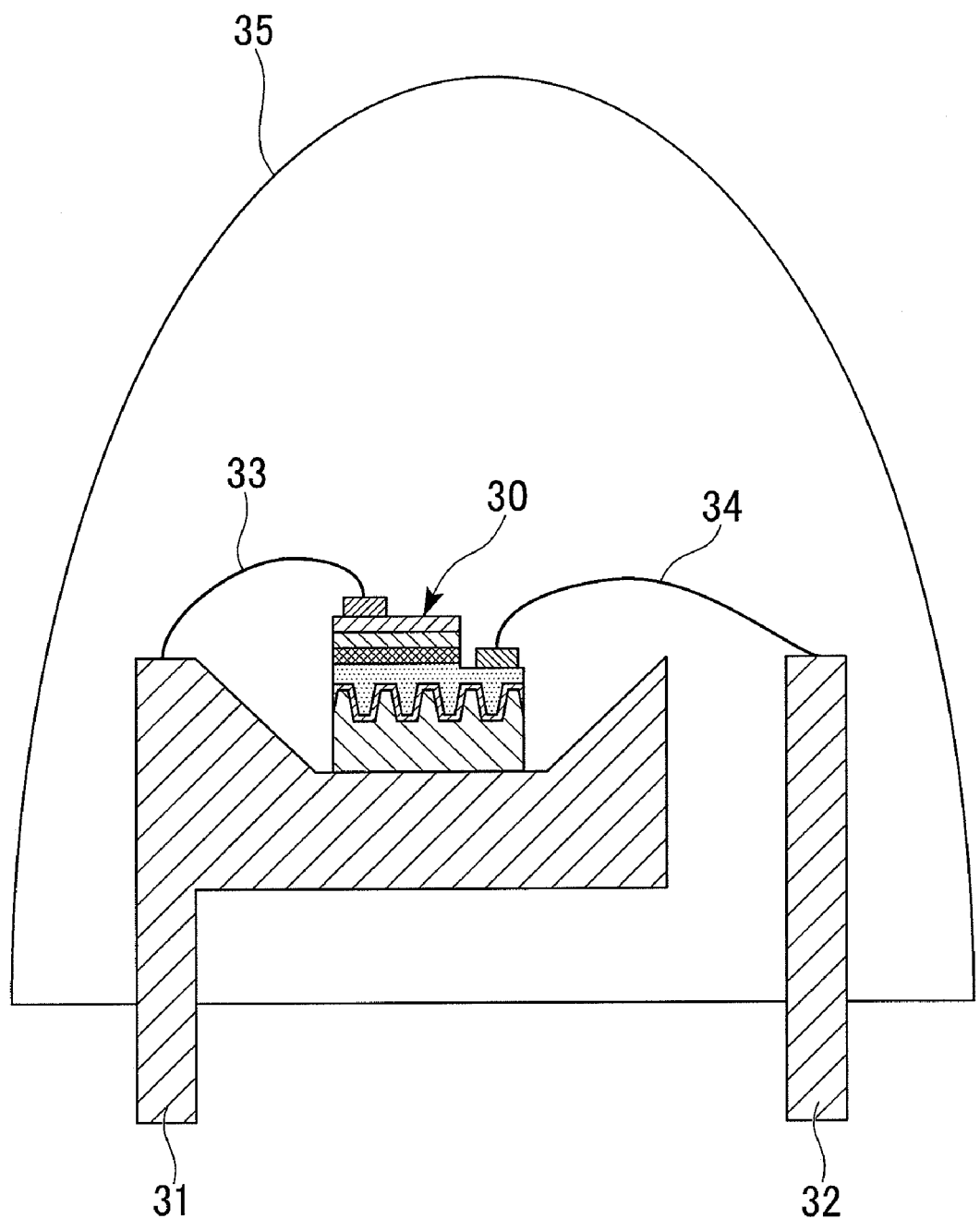
FIG. 6 shows an example where a cannonball shaped lamp is produced using the light emitting device of the present invention.
Figure 7:
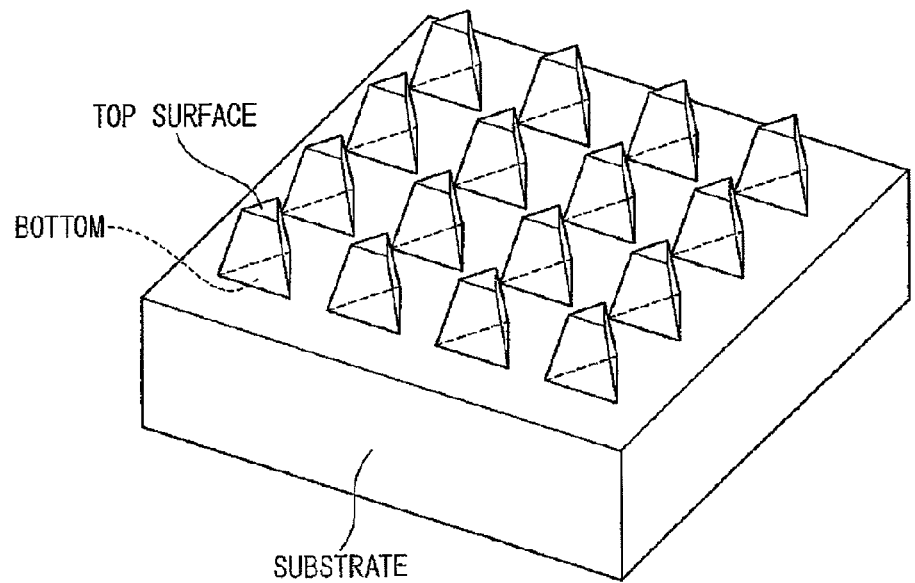
FIGS. 7-20 show additional shapes of a convex portion formed on a substrate using a nanoimprint process.
Figure 8:
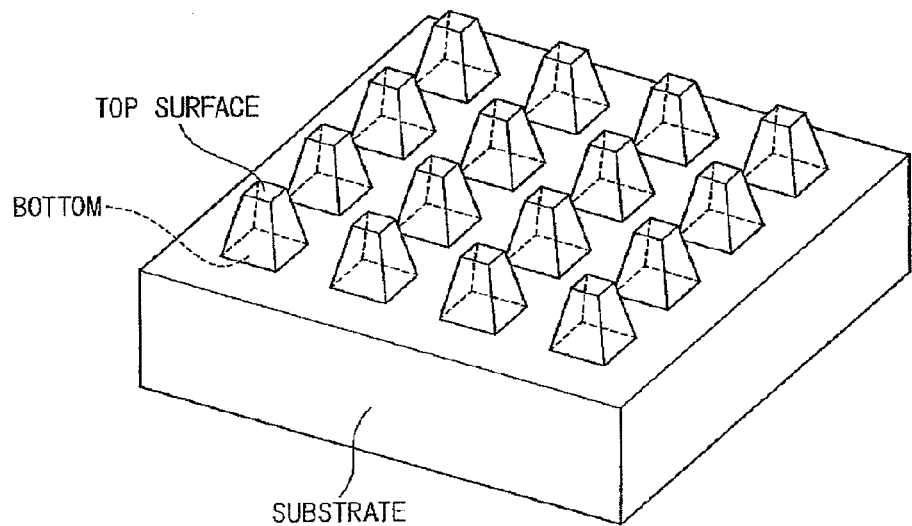
Figure 9:
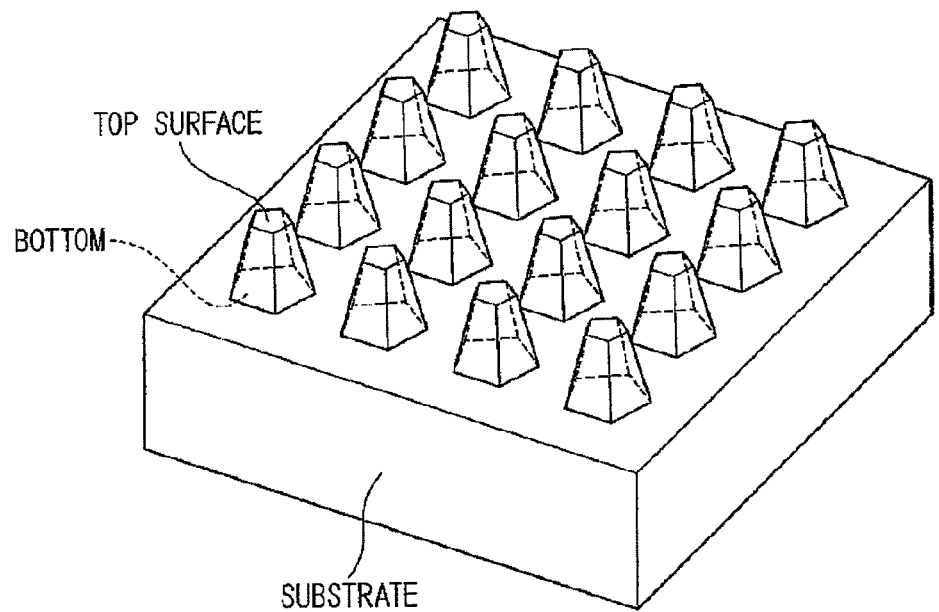
Figure 10:
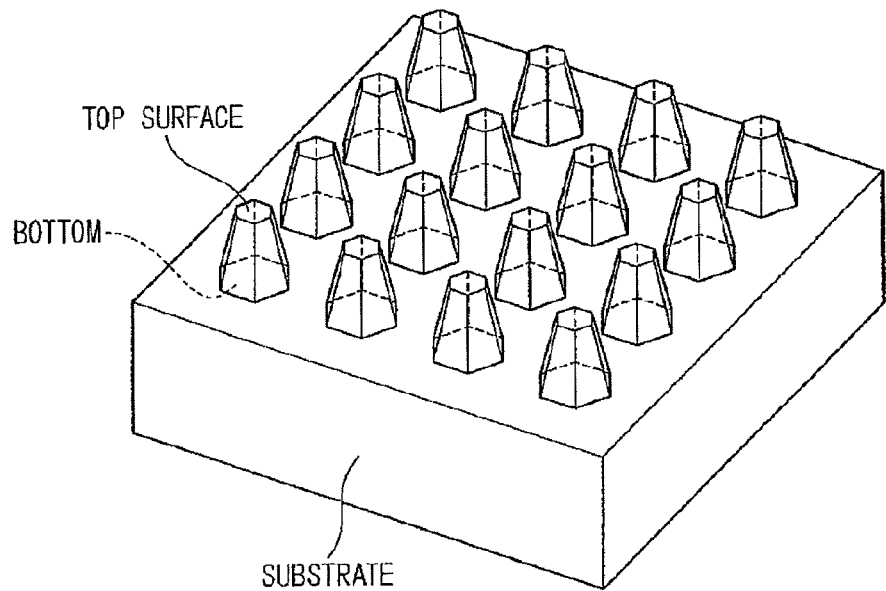
Figure 11:
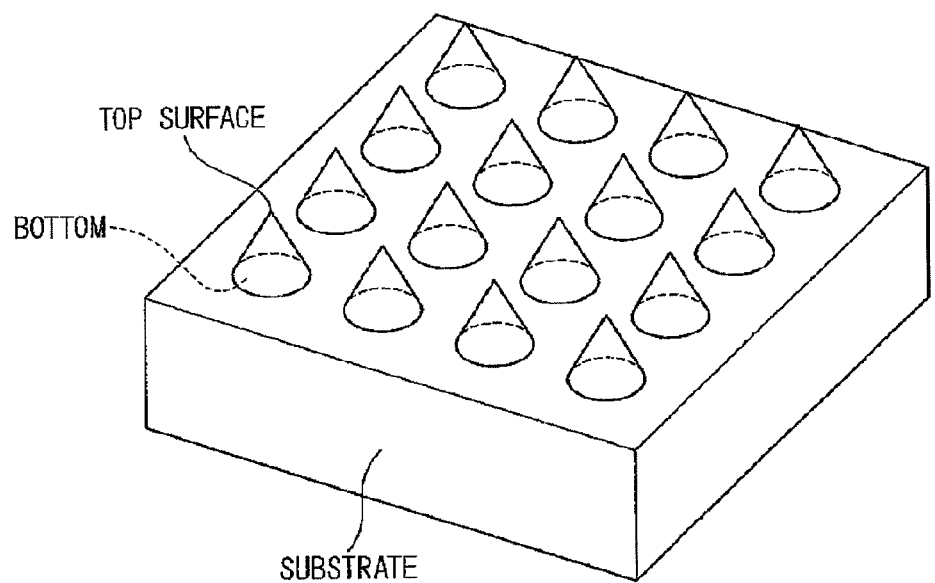
Figure 12:
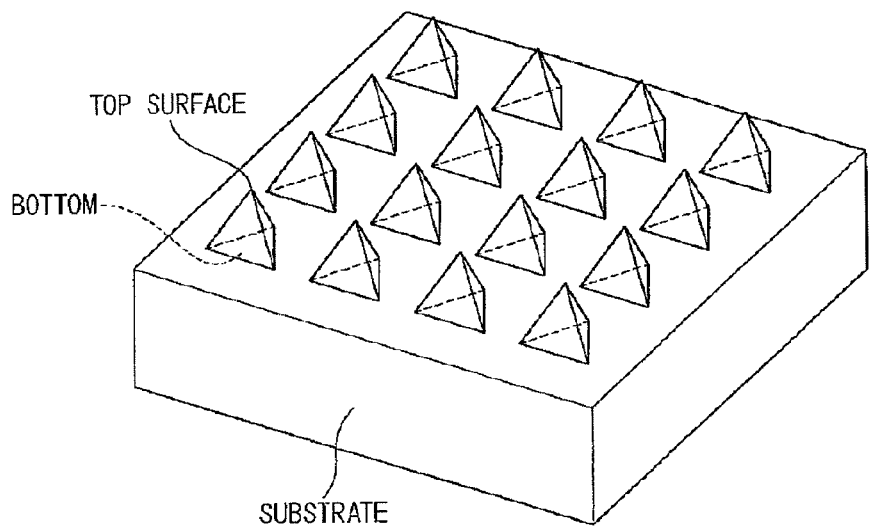
Figure 13:
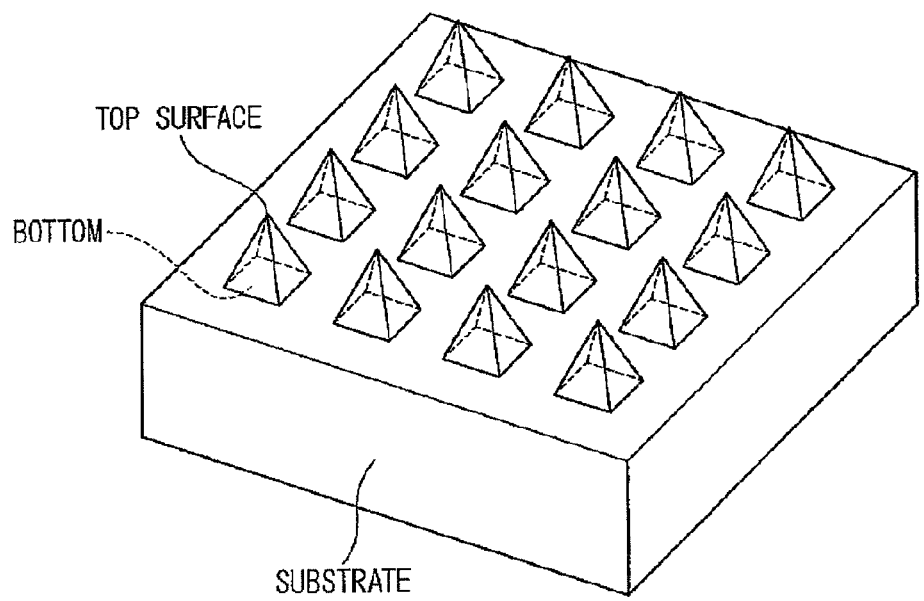
Figure 14:
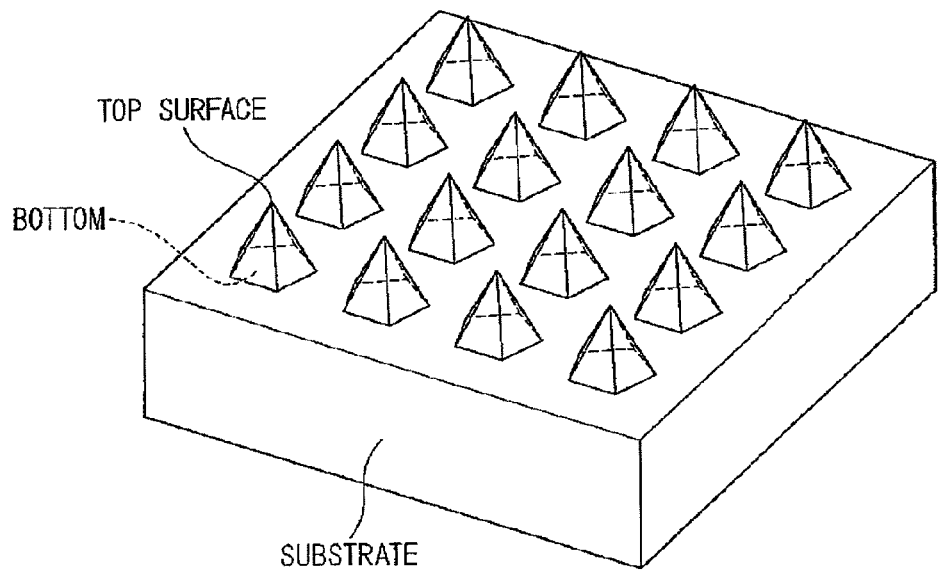
Figure 15:
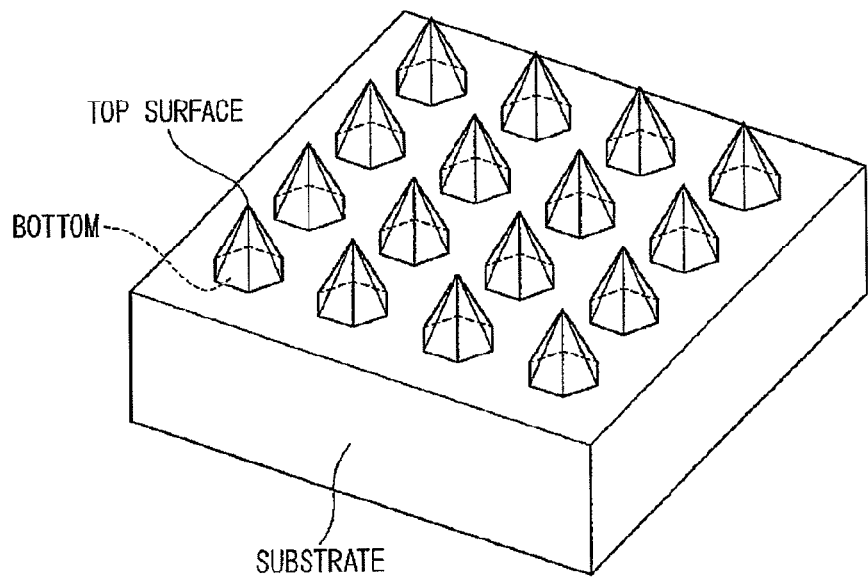
Figure 16:
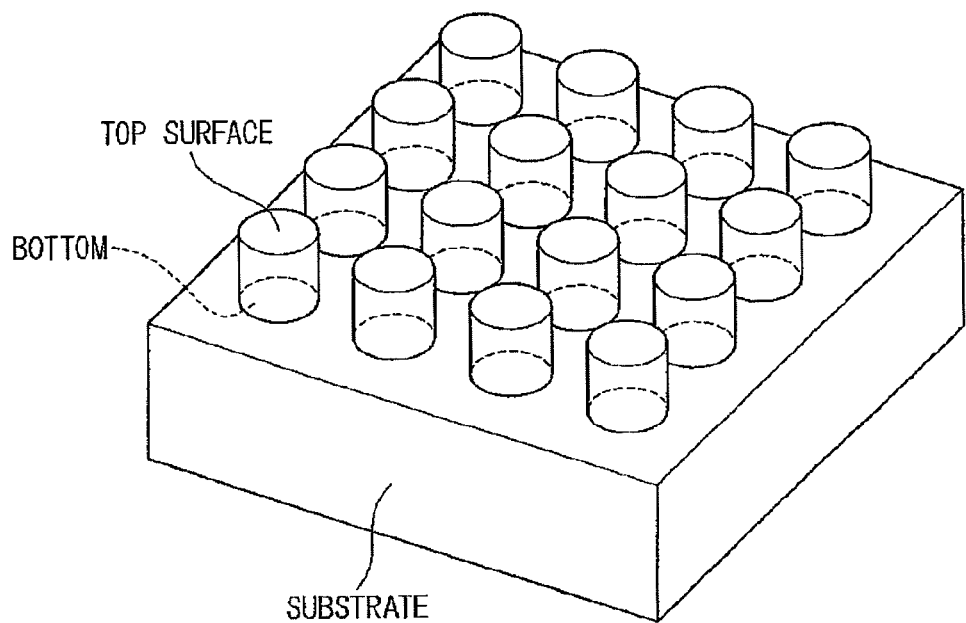
Figure 17:
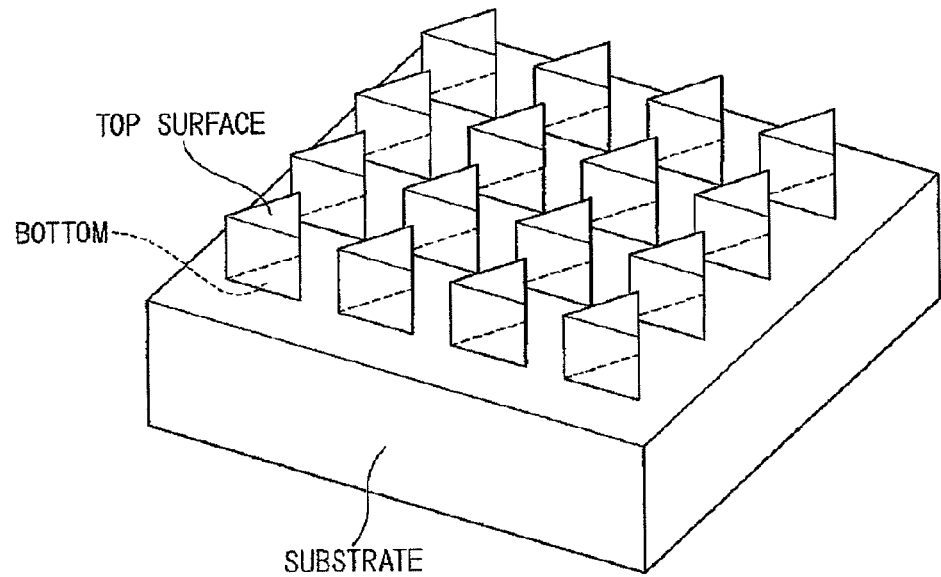
Figure 18:
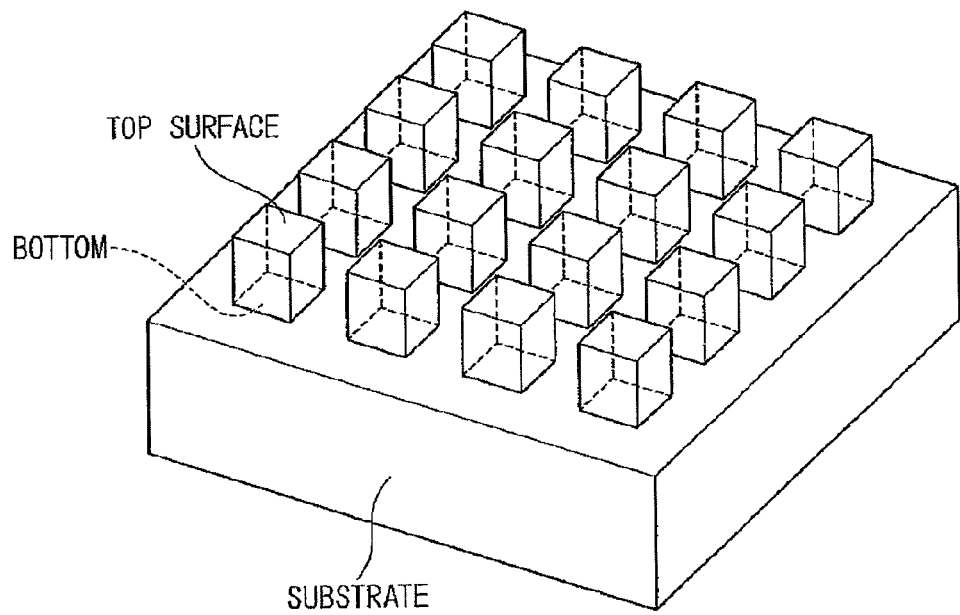
Figure 19:
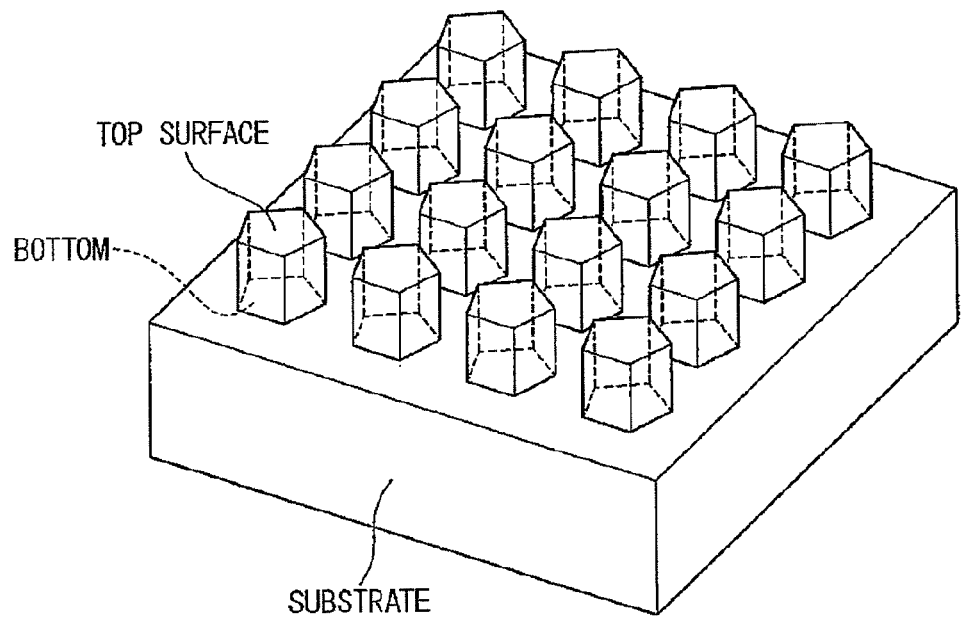
Figure 20:
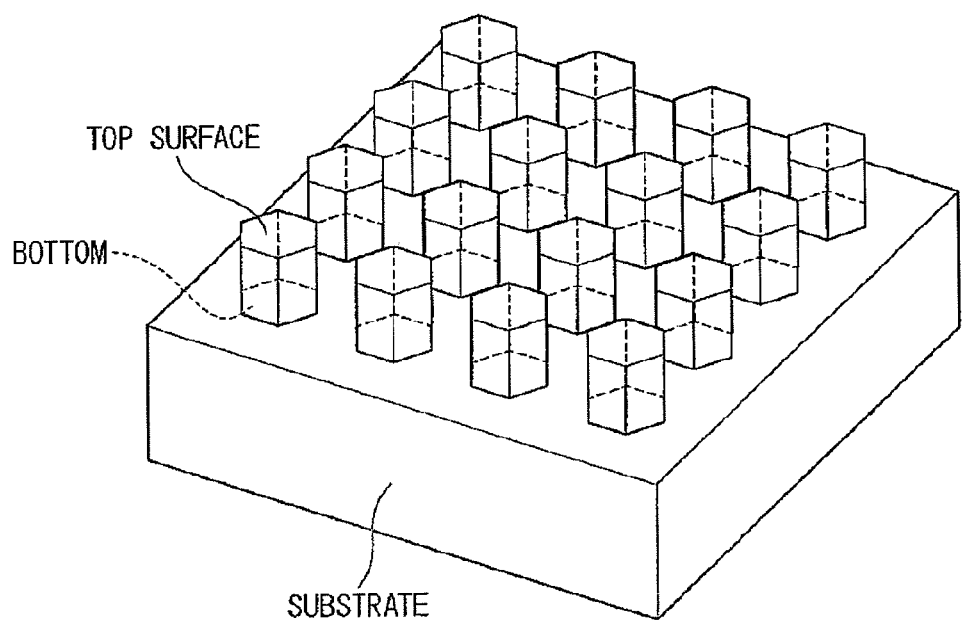
Figure 21:
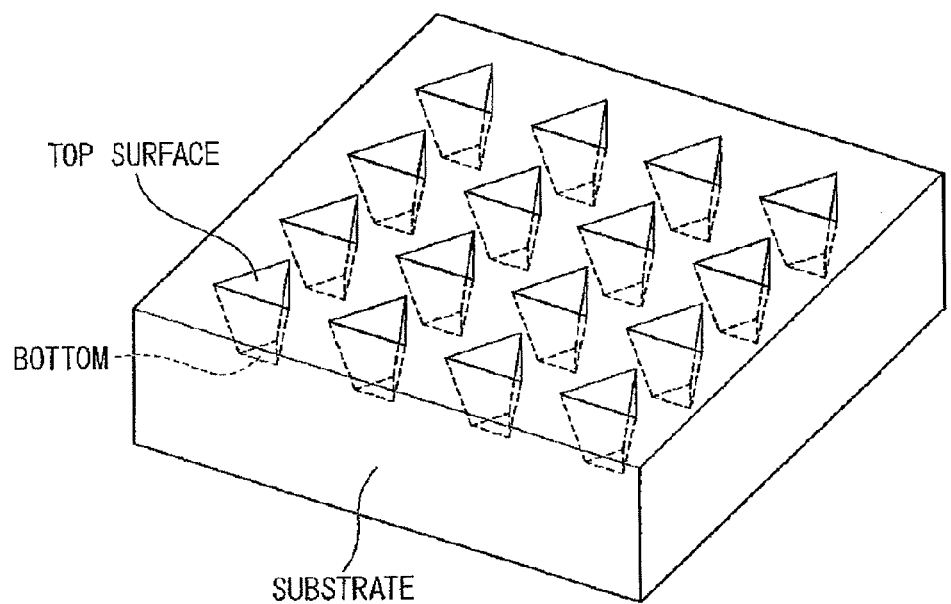
FIGS. 21-35 show additional shapes of a concave portion formed on a substrate using a nanoimprint process.
Figure 22:
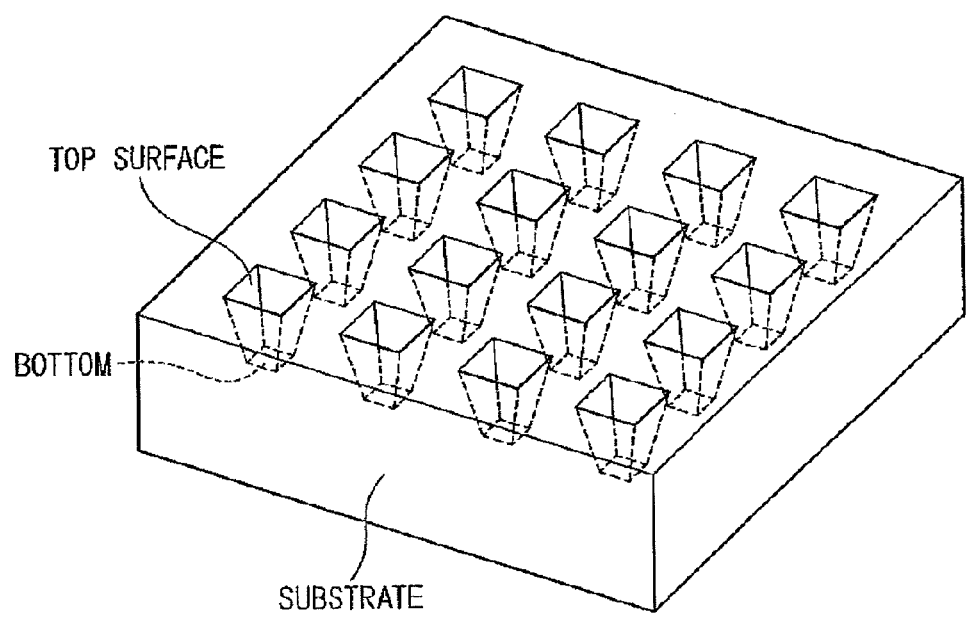
Figure 23:
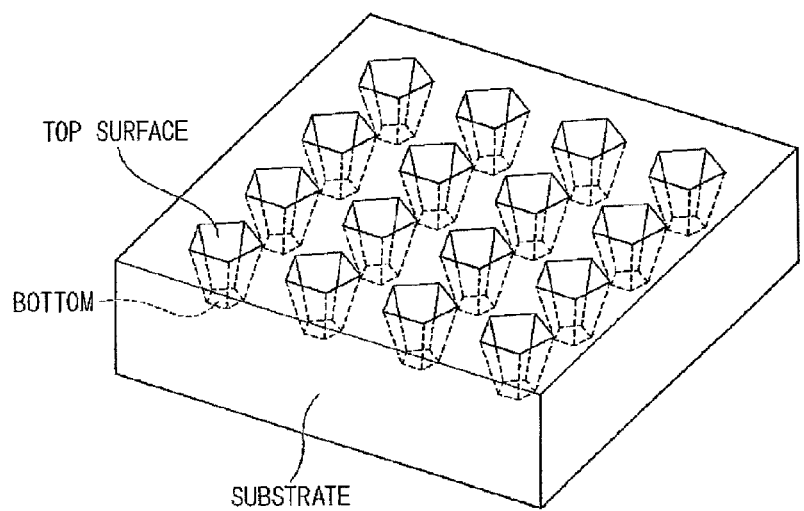
Figure 24:
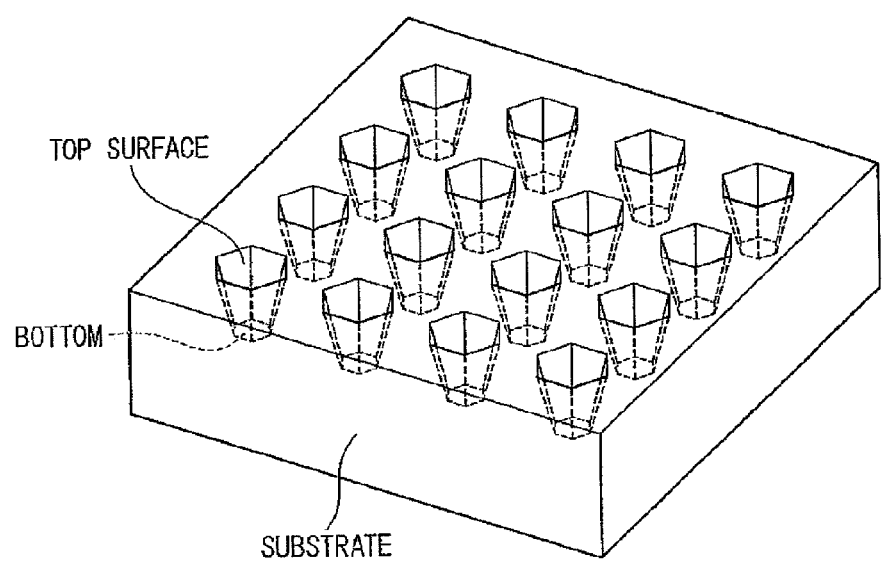
Figure 25:
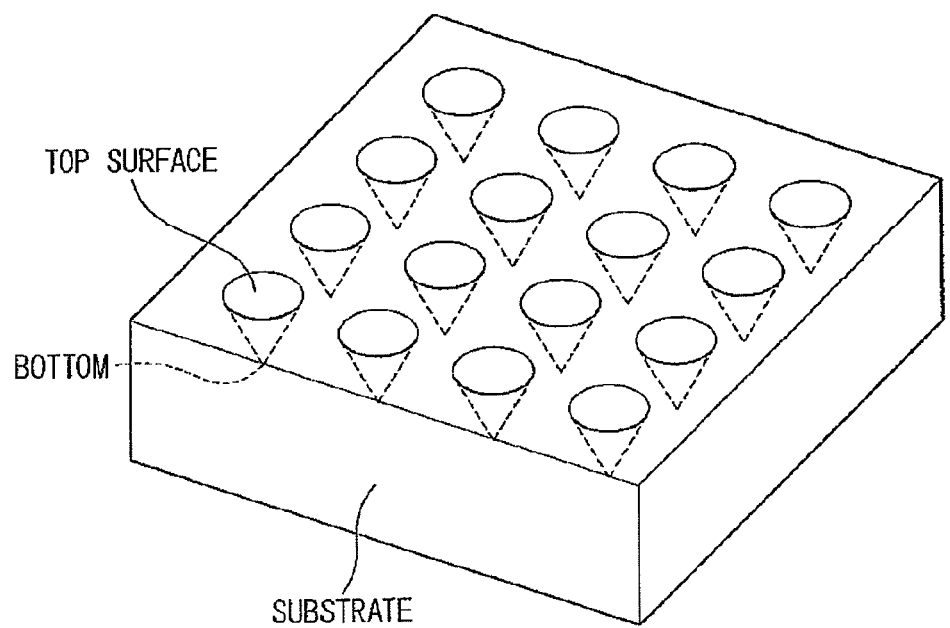
Figure 26:
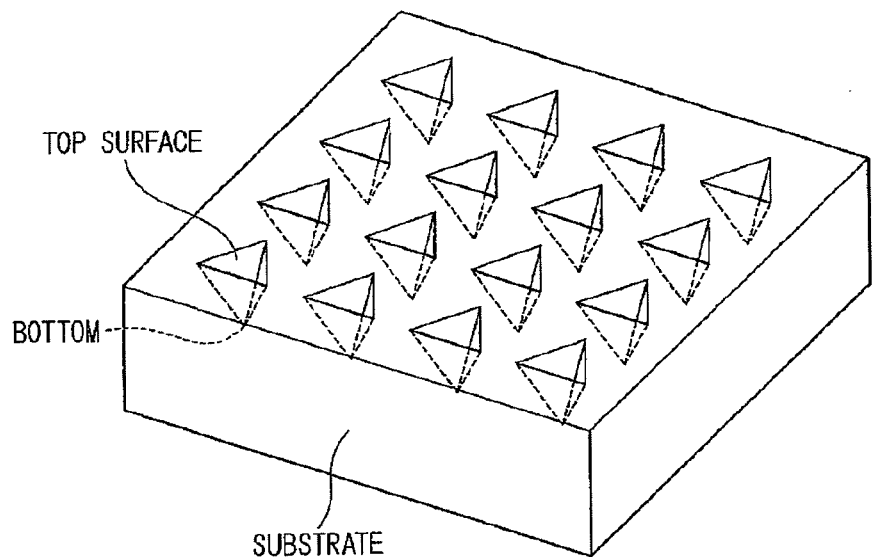
Figure 27:
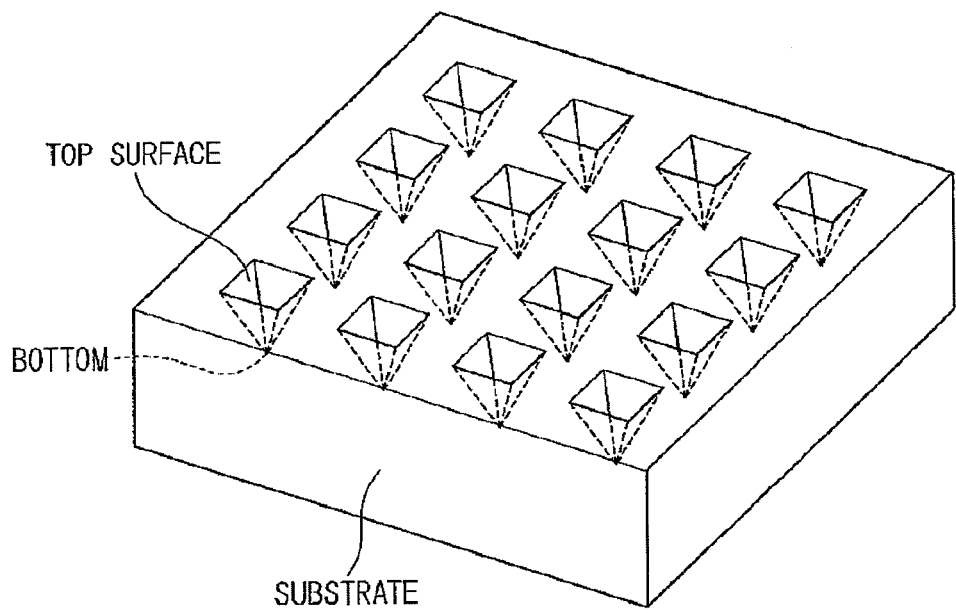
Figure 28:
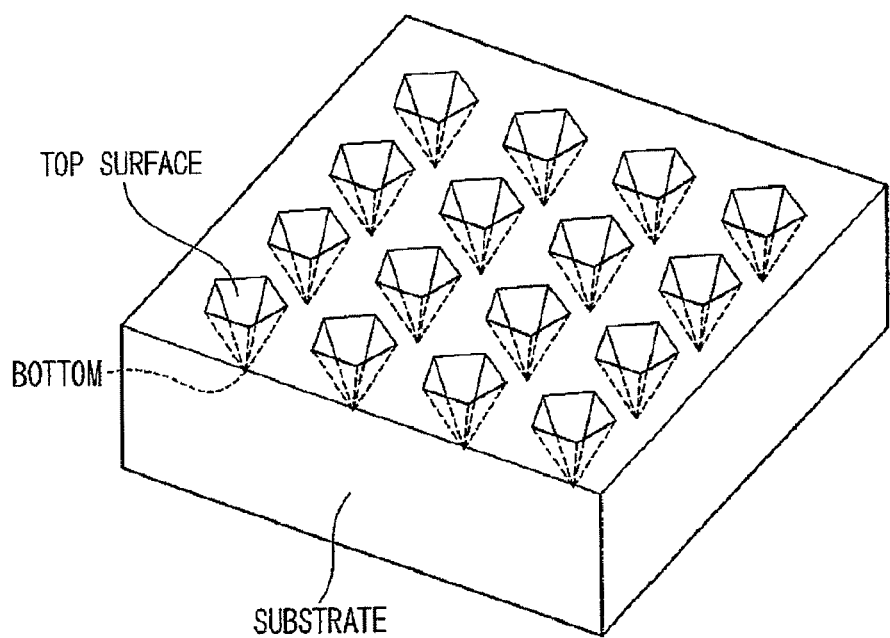
Figure 29:
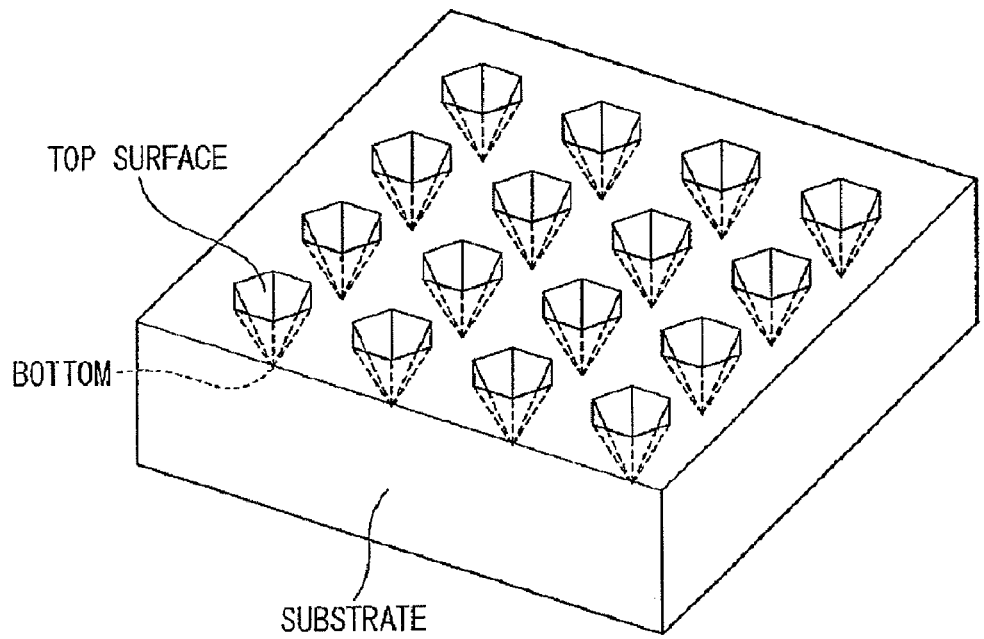
Figure 30:
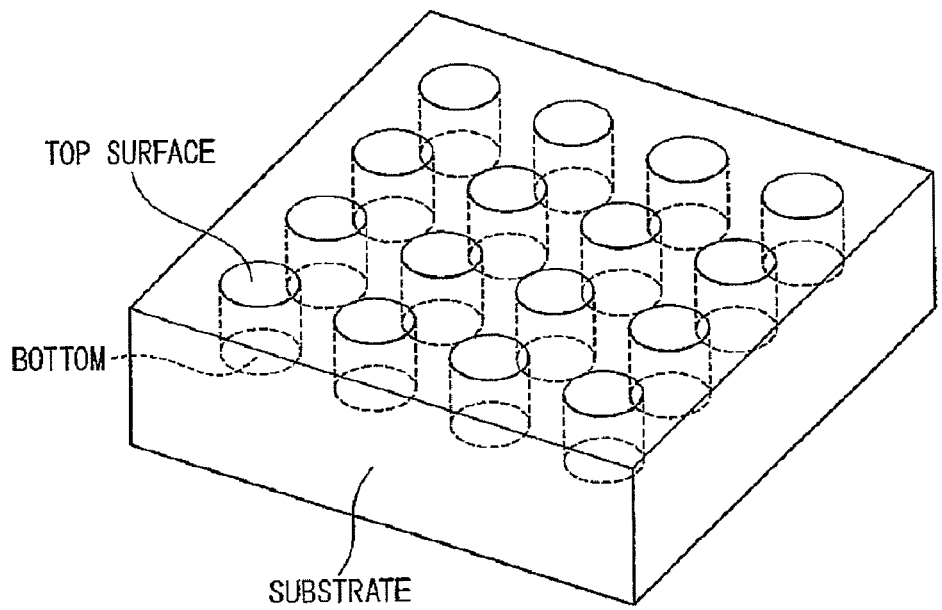
Figure 31:
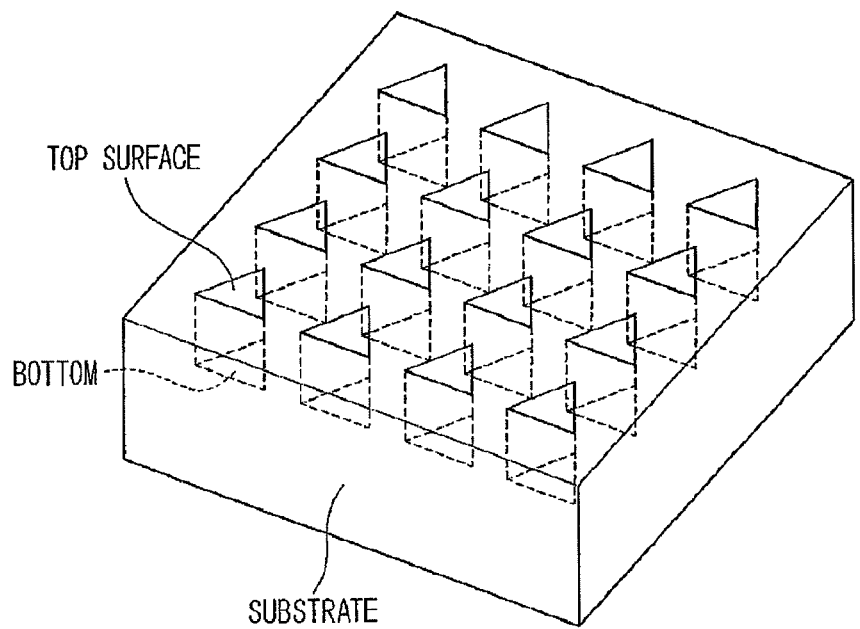
Figure 32:
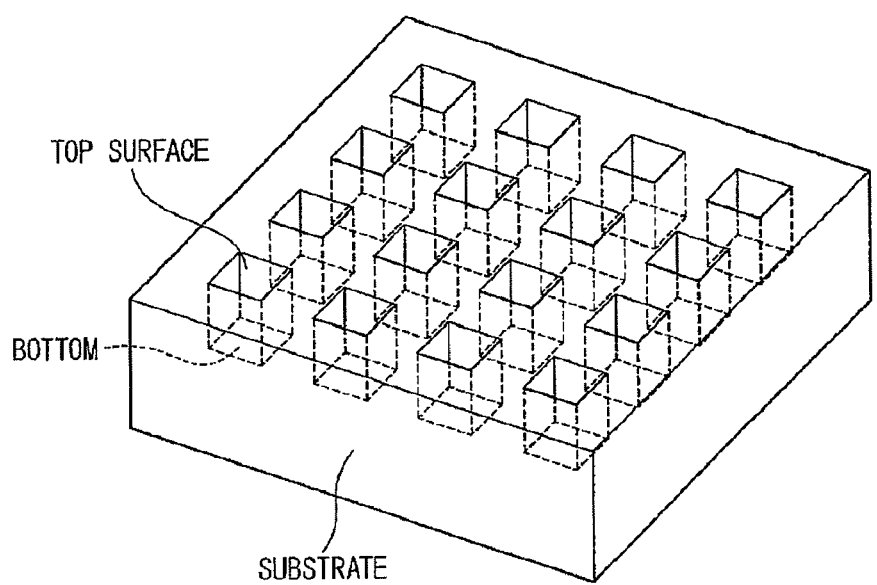
Figure 33:
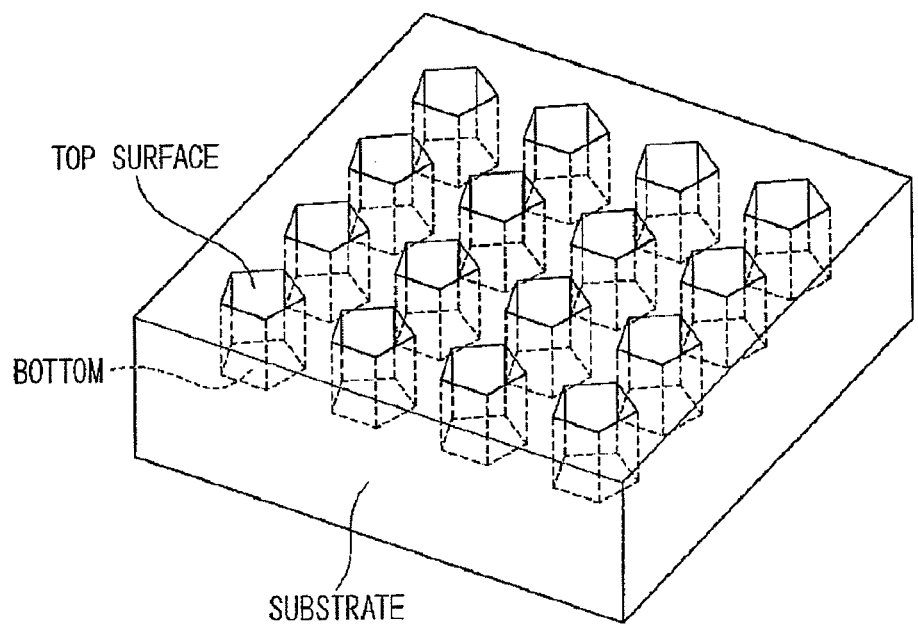
Figure 34:
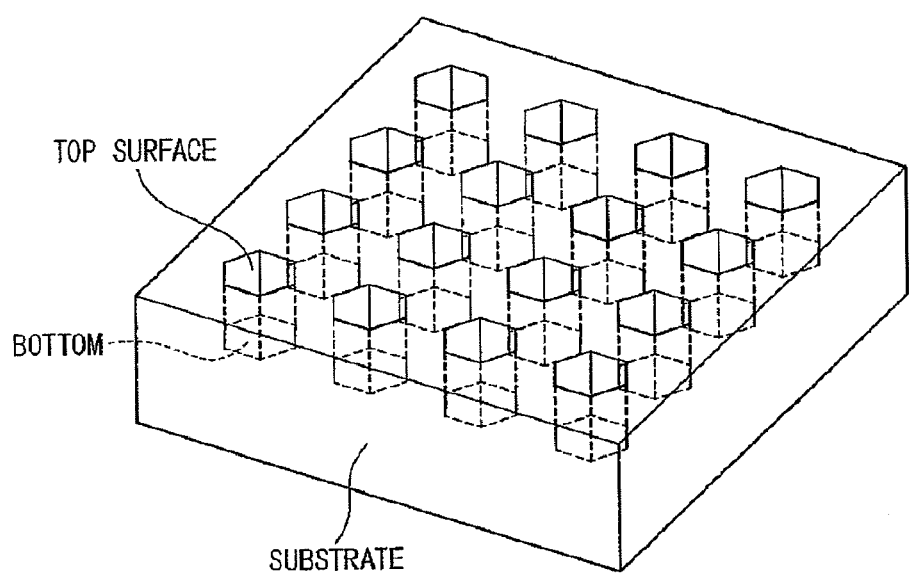
Figure 35:
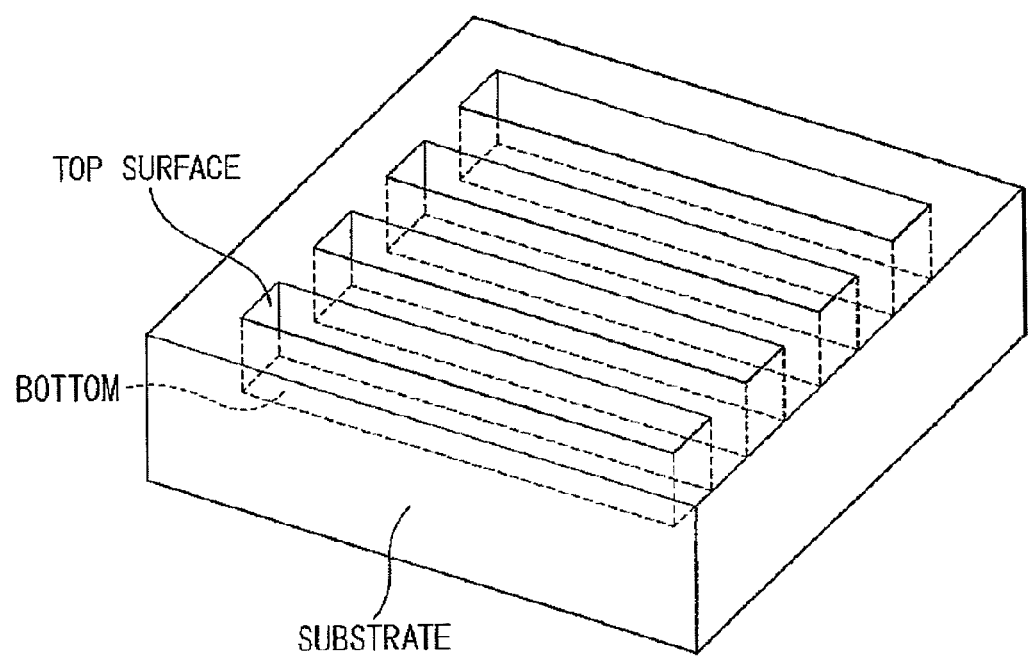

In addition, as shown in FIG. 6 for example, the gallium nitride based compound semiconductor light emitting device of the present invention may be used to form an LED lamp using a conventionally known method without any limitations. The gallium nitride based compound semiconductor light emitting device may be used for various types of lamps, such as a general-purpose cannonball shaped lamp, a side view type lamp for a backlight of a mobile phone, or a top view type lamp used for a display device. For example, when a face-up gallium nitride based compound semiconductor light emitting device shown in FIG. 1 is mounted to the cannonball shaped lamp, as shown in the drawing, the gallium nitride based compound semiconductor light emitting device 30 is adhered to one of two frames 31 and 32 by resin or the like, and the positive electrode bonding pad and the negative electrode bonding pad are bonded to the frames 31 and 32 by wires 33 and 34 formed of gold or the like, respectively. Then, the periphery of the device is molded by a transparent resin (as a mold 35), thereby producing a cannonball shaped lamp.

EXAMPLES

The present invention will be described below in more detail with reference to Examples. However, the present invention is not limited to these Examples.

Example 1

FIG. 1 is a cross sectional diagram schematically showing a gallium nitride based compound semiconductor light emitting device produced in the present Experimental example.

(Method for Producing Sapphire Substrate with Uneven Pattern Composed of Convex Shape or Concave Shape)

A sapphire single crystal was used for a substrate. A concave shape was formed on the sapphire single crystal substrate by employing a known photolithography method. $BCl_3$ was used as an etching gas for etching the sapphire single crystal substrate. A truncated cone shape (top dimension: 4 μm, bottom dimension: 2 μm, height: 6 μm, and periodic interval: 8 μm) was formed as the concave shape.

(Sputtering Method)

AlN was deposited by the RF sputtering method. Al was used as a target and an AlN layer was formed by a process of reactive sputtering with $N_2$. By using the pivoted magnetron magnetic circuit, the layer was formed due to the reciprocating movement (one reciprocating movement in 30 seconds) of the simple harmonic oscillating mechanism. The substrate temperature was 700° C. and the layer was formed so as to achieve a film thickness of 50 nm.

(Production of Gallium Nitride Based Compound Semiconductor Light Emitting Device)

After forming a buffer layer made of AlN, a gallium nitride based compound semiconductor layer was laminated thereon by the sputtering method. The gallium nitride based compound semiconductor layer was formed by laminating an n-type semiconductor layer, a light emitting layer having a multiple quantum well structure, and a p-type semiconductor layer in this order. The n-type semiconductor layer was formed by laminating an undoped GaN underlying layer with a thickness of 6 μm, a Ge-doped n-type GaN contact layer with a thickness of 2 μm, and an n-type $In_{0.1}Ga_{0.9}N$ cladding layer with a thickness of 0.02 μm in this order. The light emitting layer having a multiple quantum structure was formed by providing a barrier layer on five laminates of a Si-doped GaN barrier layer with a thickness of 16 nm and an $In_{0.06}Ga_{0.94}N$ well layer with a thickness of 2.5 nm. The p-type semiconductor layer was formed by laminating a Mg-doped p-type $Al_{0.07}Ga_{0.93}N$ cladding layer with a thickness of 0.01 μm and a Mg-doped p-type $Al_{0.02}Ga_{0.98}N$ contact layer with a thickness of 0.18 μm in this order. The semiconductor was configured such that light was emitted from the surface of the semiconductor layer.

In this structure, the carrier concentration of the n-type GaN contact layer was $1\times10^{19}$ cm$^3$, and the doping amount of Si in the GaN barrier layer was $1\times10^{17}$ cm$^{-3}$. The carrier concentration of the p-type AlGaN contact layer was $5\times10^{18}$ cm$^{-3}$, and the doping amount of Mg in the p-type AlGaN cladding layer was $5\times10^{19}$ cm$^3$.

In addition, the laminated structure of the gallium nitride based compound semiconductor layer was formed by an MOCVD method under usual conditions well known in the technical field.

Then, the n-type GaN contact layer in a region for forming the negative electrode was exposed from the gallium nitride based compound semiconductor layer by a reactive ion etching method. In this case, first, a resist was uniformly applied on the entire surface of the p-type semiconductor layer, and the resist was then removed from the region for forming the negative electrode by a known lithography technique. Then, the laminated structure was put into a vacuum deposition apparatus, and Ni and Ti were deposited at a pressure of $4\times10^{-4}$ Pa or less by an electron beam method to form films with thicknesses of 50 nm and 300 nm, respectively. Thereafter, the resist and a metal film other than those on the region for forming the negative electrode were removed by a lift-off technique.

Then, a semiconductor laminated substrate was mounted on the electrode in an etching chamber of the reactive ion etching apparatus and the pressure of the etching chamber was reduced to $10^{-4}$ Pa. Thereafter, the semiconductor laminate was etched until the n-type GaN contact layer was exposed by supplying Cl$_2$, serving as an etching gas. After the etching process, the semiconductor laminate was taken out from the reactive ion etching apparatus, and the etching mask was removed by nitric acid and fluoric acid.

(Formation of Translucent Positive Electrode)

Next, a current spreading layer made of ITO (translucent positive electrode) was formed only in the region for forming the positive electrode on the surface of the p-type AlGaN contact layer employing a known photolithography technique and a known lift-off technique. In the formation of the current spreading layer, the substrate having the gallium nitride based compound semiconductor layer laminated thereon was first put into a vacuum sputtering apparatus and ITO was deposited so as to achieve a film thickness of 300 nm on the p-type AlGaN contact layer. Then, the substrate was taken out from the vacuum chamber, and a heat treatment was performed in order to improve transparency.

(Formation of Bonding Pad)

Next, the positive electrode bonding pad and the negative electrode bonding pad were formed as follows.

First, a first layer made of Au, a second layer made of Ti, a third layer made of Al, a fourth layer made of Ti, and a fifth layer made of Au were sequentially formed on a portion of the ITO film by a known procedure called lift-off and the same deposition method as described above, thereby forming the five-layer structured positive electrode bonding pad 17. The thicknesses of the Au, Ti, Al, Ti, and Au layers were 50 nm, 20 nm, 10 nm, 100 nm, and 500 nm, respectively.

Then, the negative electrode bonding pad was formed on the n-type GaN contact layer, which was exposed by the reactive ion etching method as described above, due to the following processes.

First, a resist was uniformly applied on the entire surface of the exposed region of the n-type GaN contact layer, and the resist was then removed from a portion for forming the negative electrode on the exposed n-type GaN contact layer by a known lithography technique. Then, Ti and Au were respectively deposited with thicknesses of 100 nm and 500 nm on the semiconductor in this order by a general vacuum deposition method, thereby forming the negative electrode bonding pad. Then, the resist was removed by a known method.

Then, the back surface of the substrate in the wafer having the positive electrode and the negative electrode formed thereon as described above was ground/polished such that the thickness of the substrate was reduced to 80 μm, and a laser scriber was used to mark the semiconductor. Then, the semiconductor was cut into chips each having a 350 μm square.

(Measurement of Driving Voltage (Vf) and Emission Power (Po))

A current of 20 mA was applied to the chip through a probe to measure a forward voltage (driving voltage: Vf). As a result, the forward voltage was 3.3 V.

In addition, the chip was mounted to a TO-18 package, and the emission power thereof was measured by a tester. When a current of 20 mA was applied, the emission power was 16 mW. In addition, in terms of light emission distribution in the light emitting surface, it was verified that light was emitted from the entire surface of the translucent positive electrode.

Comparative Example 1

A gallium nitride based compound semiconductor light emitting device was produced in a similar manner to that of Example 1, except that the AlN buffer layer was formed by employing the MOCVD method instead of the sputtering method.

A current of 20 mA was applied to the chip through a probe to measure a forward voltage (driving voltage: Vf). As a result, the forward voltage was 3.3 V.

In addition, the chip was mounted to a TO-18 package, and the emission power thereof was measured by a tester. When a current of 20 mA was applied, the emission power was 13 mW. In addition, in terms of light emission distribution in the light emitting surface, it was verified that light was emitted from the entire surface of the translucent positive electrode.

Comparative Example 2

A gallium nitride based compound semiconductor light emitting device was produced in a similar manner to that of Example 1, except that no uneven pattern composed of concave shapes and convex shapes was formed on the sapphire substrate.

A current of 20 mA was applied to the chip through a probe to measure a forward voltage (driving voltage: Vf). As a result, the forward voltage was 3.3 V.

In addition, the chip was mounted to a TO-18 package, and the emission power thereof was measured by a tester. When a current of 20 mA was applied, the emission power was 12 mW. In addition, in terms of light emission distribution in the light emitting surface, it was verified that light was emitted from the entire surface of the translucent positive electrode.

It is apparent from Comparative Examples 1 and 2 that the output improves when an uneven pattern composed of concave shapes and convex shapes is formed on the sapphire substrate. In addition, it is clear from Example 1 and Comparative Example 1 that, in addition to the formation of an uneven pattern composed of a concave shape or a convex shape on the sapphire substrate, the formation of a buffer layer by the sputtering method further improves the output.

INDUSTRIAL APPLICABILITY

The present invention can be applied to a light emitting device, and in particular can be applied to a method for producing a light emitting device that is highly reliable and has excellent light emission efficiency and a lamp that includes the light emitting device produced by employing the method.

The invention claimed is:

1. A method for producing a GaN based semiconductor light emitting device having at least a buffer layer, an n-type semiconductor layer, a light emitting layer, and a p-type semiconductor layer on a translucent substrate, the method comprising:

providing a translucent substrate having formed thereon an uneven pattern composed of a convex shape on an upper surface thereof;

wherein a height of the convex shape is 0.1 µm to 2 µm; and forming the buffer layer by a sputtering method, wherein the buffer layer is formed such that a lower surface and an upper surface of the buffer layer assume a shape of the uneven pattern of the upper surface of the translucent substrate, and a pattern of the lower and upper surfaces of the buffer layer is congruent with the uneven pattern of the upper surface of the translucent substrate, and wherein a size of the convex shape satisfies the following relationship:

a diameter of a bottom of the convex shape or a length of a diagonal line of the convex shape is less than the height of the convex shape.

2. The method for producing a GaN based semiconductor light emitting device according to claim 1, wherein the sputtering method is conducted in an apparatus having a pivoted magnetron magnetic circuit.

3. The method for producing a GaN based semiconductor light emitting device according to claim 1, wherein the buffer layer comprises of AlN, ZnO, Mg, or Hf.

4. The method for producing a GaN based semiconductor light emitting device according to claim 1, wherein the buffer layer comprises of AlN.

5. The method for producing a GaN based semiconductor light emitting device according to claim 1, wherein the translucent substrate is a sapphire single crystal.

6. The method for producing a GaN based semiconductor light emitting device according to claim 1, wherein the convex shape is a truncated cone and the height of the truncated cone is greater than the bottom diameter of the truncated cone.

7. The method for producing a GaN based semiconductor light emitting device according to claim 1, wherein the convex shape is a truncated polygonal pyramid such as a truncated triangular pyramid, a truncated quadrangular pyramid, a truncated pentagonal pyramid, and a truncated hexagonal pyramid, or the height of the truncated polygonal pyramid is greater than a diagonal line of the bottom of the truncated polygonal pyramid.

8. The method for producing a GaN based semiconductor light emitting device according to claim 1, wherein the convex shape is a circular cone and the height of the circular cone is greater than the bottom diameter of the circular cone.

9. The method for producing a GaN based semiconductor light emitting device according to claim 1, wherein the convex shape is a polygonal pyramid such as a triangular pyramid, a quadrangular pyramid, a pentagonal pyramid, or a hexagonal pyramid, and the height of the polygonal pyramid is greater than a diagonal line of the bottom of the polygonal pyramid.

10. The method for producing a GaN based semiconductor light emitting device according to claim 1, wherein the convex shape is a circular cylinder and a height of the circular cylinder is greater than the bottom diameter of the circular cylinder.

11. The method for producing a GaN based semiconductor light emitting device according to claim 1, wherein the convex shape is a polygonal prism such as a triangular prism, a quadrangular prism, a pentagonal prism, or a hexagonal prism, and the height of the polygonal prism is greater than a diagonal line of the bottom of the polygonal prism.

12. The method for producing a GaN based semiconductor light emitting device according to claim 1, wherein a lower surface of the n-type semiconductor layer abuts the upper surface of the buffer layer and assumes the shape of the upper surface of the buffer layer, and the substrate is a sapphire substrate.

* * * * *